United States Patent [19]
Nakata et al.

[11] Patent Number: 5,436,468
[45] Date of Patent: Jul. 25, 1995

[54] ORDERED MIXED CRYSTAL SEMICONDUCTOR SUPERLATTICE DEVICE

[75] Inventors: Yoshiaki Nakata; Osamu Ueda; Satoshi Nakamura, all of Kawasaki, Japan

[73] Assignee: Fujitsu Limited, Kawasaki, Japan

[21] Appl. No.: 308,217

[22] Filed: Sep. 19, 1994

Related U.S. Application Data

[63] Continuation of Ser. No. 31,850, Mar. 16, 1993, abandoned.

[30] Foreign Application Priority Data

| Mar. 17, 1992 | [JP] | Japan | 4-060167 |
| Aug. 24, 1992 | [JP] | Japan | 4-223793 |
| Oct. 9, 1992 | [JP] | Japan | 4-271969 |

[51] Int. Cl.$^6$ .................. H01L 29/04; H01L 29/161
[52] U.S. Cl. ......................... 257/15; 257/14; 257/22; 257/628
[58] Field of Search ............. 257/15, 17, 20, 21, 257/22, 24, 194, 201, 628

[56] References Cited

U.S. PATENT DOCUMENTS

| 4,591,889 | 5/1986 | Gossard et al. | 257/15 |
| 4,983,540 | 1/1991 | Yamaguchi et al. | 257/15 |
| 5,070,375 | 12/1991 | Yamaguchi et al. | 257/15 |
| 5,073,893 | 12/1991 | Kondou | 257/15 |

FOREIGN PATENT DOCUMENTS

| 61-23364 | 1/1986 | Japan | 257/194 |
| 0226078 | 1/1990 | Japan | 257/20 |
| 02139970 | 5/1990 | Japan | 257/17 |

OTHER PUBLICATIONS

Yasuhiro Tokura et al., Journal of Crystal Growth 94 (1989) 46.
S. A. Chalmers et al., Applied Phys. Lett 61 (1992) 645.
M. Krishnamurthy et al., Applied Phys. Lett. 62 (1993) 1922.
R. Nötzel et al., Applied Phys. Lett. 60 (1992) 1615.
S. Hasegawa et al., Journal of Crystal Growth 111 (1991) 371.
M. Sato et al., Superlattices and Microstructures 7 (1990) 279.
P. R. Pukite et al., Journal of Crystal Growth 95 (1989) 269.
M. Tanaka et al., Record of Alloy Semiconductor Physics and Electronics Symposium (1990), p. 195.
Y. Horikoshi et al., Journal of Crystal Growth 105 (1990) 326.
M. D. Pushley et al., Applied Phys. Lett. 58 (1991) 406.
T. Fukui et al., J. Vac. Sci. Technol. B 6 (1988) 1373.
P. M. Petroff et al., Mat. Res. Soc. Symp. Proc. 237 (1992) 467.
W. I. Wang, J. Vac. Sci. Technol. B 1 (1983) 630.
P. N. Fawcett et al., Surf. Sci. 296 (1993) 67.
M. Krishnamurth et al., Mat. Res. Soc. Symp. Proc. 237 (1992) 473.

Primary Examiner—Mahshid D. Saadat
Attorney, Agent, or Firm—Staas & Halsey

[57] ABSTRACT

On a substrate having a surface slightly tilted by an angle $\alpha$ within the range of from 0.5 to 10 degrees from the (110) plane in the $<00\text{-}1>$ direction, a superlattice structure having a periodicity in both $<110>$ and $<001>$ directions is formed. Various band structures are possible by selecting an appropriate constituent material and periodicity for the superlattice structure. When current flows in a direction without periodicity, a very high mobility is obtained as a result of suppressed alloy scattering. If current is caused to flow in a direction with periodicity, and the periodicity is properly selected, optical phonon scattering can also be suppressed.

17 Claims, 25 Drawing Sheets

L: PERIOD

TERRACE WIDTH (STEP PITCH)

$\ell = d_{220} / \tan \alpha$

ONE-DIMENSIONAL
QUANTUM WELL
STRUCTURE
(QUANTUM WELL STRUCTURE)

TWO-DIMENSIONAL
QUANTUM WELL
STRUCTURE
(QUANTUM WIRE)

THREE-DIMENSIONAL
QUANTUM WELL
STRUCTURE
(QUANTUM BOX)

△ : In
□ : Ga
○ : As (110) PLANE GROWTH — HIGH MOBILITY ON TERRACE (001) PLANE GROWTH — LOW MOBILITY ON TERRACE
TWO BONDS (+ DIMER STRUCTURE) → (STABLE)

InAs/GaAs ALTERNATE MONO MOLECULAR LAYER SUPERLATTICE

| | |
|---|---|
| $E_1$min | 192 (mev) |
| $E_1$max | 218 (mev) |
| $E_2$min | 607 (mev) |
| $E_2$max | 807 (mev) |
| $E_1$max − $E_1$min | 26 (mev) |
| $E_2$min − $E_1$max | 389 (mev) |

103 104
101 GaAs  102 InAs 67.505Å — 67.505Å — 0.325(eV)
0.325(eV)
2.935Å
8.805Å

| | |
|---|---|
| $E_1$ min | 300 (mev) |
| $E_1$ max | 320 (mev) |
| $E_2$ min | 379 (mev) |
| $E_2$ max | 468 (mev) |
| $E_1$ max − $E_1$ min | 19 (mev) |
| $E_2$ min − $E_1$ max | 59 (mev) |

ORDERED MIXED CRYSTAL SEMICONDUCTOR SUPERLATTICE DEVICE

This application is a continuation of application Ser. No. 08/031,850, filed Mar. 16, 1993, now abandoned.

BACKGROUND OF THE INVENTION a) Field of the Invention

The present invention relates to semiconductor devices, and more particularly to semiconductor devices using a group III-V compound semiconductor crystal in a charge carrier transport region or a region adjacent thereto.

b) Description of the Related Art

Group III-V semiconductors have various excellent properties and are used in optical semiconductor devices having a direct transition (direct gap) structure, in high speed (high frequency) semiconductor devices having high charge carrier mobility characteristics, and in other semiconductor devices.

Band gap, lattice constant, refraction factor and similar characteristics of mixed crystal semiconductors consisting of two or more group III-V semiconductors can be controlled, and mixed crystal semiconductors may be used to provide semiconductor regions of desired properties. For example, various mixed crystal semiconductors are used in semiconductor laser devices in order to concentrate carriers in the active radiative region, confine radiated light within a predetermined region, and emit light having a desired wavelength.

With recent rapid progress of crystal growth technology, there have been developed molecular beam epitaxy (MBE) procedures allowing the control of film thickness and composition at the molecular level, organo-metallic vapor phase epitaxy (MOVPE) procedures, atomic layer epitaxy (ALE) procedures, and the like.

A combination of super-fine crystal growth techniques and band engineering using mixed crystals for the arbitrary control of energy ban structure, lattice constant, and the like, allows for the realization of desired electrical and optical properties in semiconductor structures. For example, it is possible to realize a quantum well structure (superlattice structure) through modulation doping, enabling separation of impurity atoms from an excessive charge carrier.

GaAs based material is widely used in field effect transistors (FETs) because this material provides substrates of a large diameter and good quality and has good lattice matching with other materials used for forming hetero-junctions. For example, high electron mobility transistors (HEMT) and the like are produced using a GaAs layer on a GaAs substrate as the electron transport layer and using an AlGaAs layer as the electron supply layer.

AlGaAs has a wider band gap and a higher conduction band energy level than GaAs. Therefore, electrons move from an n-type AlGaAs layer to an adjacent GaAs layer. Even with a GaAs layer made of a high purity (i-type) and high mobility crystal, a great number of electrons can be supplied from the AlGaAs. These electrons are trapped by a potential well formed at the hetero-junction interface, and generate a two-dimensional electron gas (2 DEG) providing high speed operation.

It is usual to form FET channels using a high electron mobility GaAs, as discussed above.

A combination of GaAs and AlGaAs does not have such a large discontinuity of the conduction band edge (about 60% of the forbidden band). Moreover, the AlGaAs layer cannot be doped at high concentrations. As a result, 2DEG concentration is low in the GaAs channel.

It is preferable to form the channel layer using a material with higher mobility, if possible, in order to develop high speed devices. Mixed crystal InGaAs semiconductors made of InAs and GaAs satisfy this condition. The channel (electron transport layer) of InGaAs provides a faster carrier drift speed than GaAs.

If an InAlAs electron supply layer is used for forming a potential barrier relative to the InGaAs channel (electron transport layer), a larger band edge discontinuity value of the conduction band and high concentration doping are possible providing the expected superior properties to a GaAs channel (electron transport layer).

However, use of mixed crystal semiconductors such as InGaAs as the channel results in the phenomenon specific to mixed crystals in terms of carrier transport.

Hot electron transistors (HET) has been developed in which hot electrons moving at high speed are used as the carrier HETs have an emitter barrier region between the emitter region and base region. Carrier electrons pass through the emitter barrier region by the tunneling effect, and electrons injected to the base region move at high speed.

A collector barrier region is also formed between the base region and the collector region. Base current stop page results when a bias voltage is supplied between the base electrode and collector electrode.

Such hot electron transistors are formed in the following manner. For example, an n-type GaAs region to be used as the collector region is formed on a semin-sulating GaAs substrate. On this GaAs region, a non-doped AlGaAs region to be used as the collector barrier region is formed. On this AlGaAs region, a GaAs region to be used as the base region is formed. On this GaAs region, a non-doped AlGaAs region to be used as the emitter barrier region is formed. On this AlGaAs region, an n-type GaAs region is formed as the emitter region. With such a hot electron transistor, when a positive voltage relative to the emitter voltage is applied to the base while maintaining the HET at 77° K. for example, electrons of the emitter region pass through the emitter barrier between the emitter and base by the tunneling effect, and move in the base region as hot electrons. The hot electrons then pass through the collector barrier between the base and collector. Most of the hot electrons thus reach the collector. Very high speed transistor operation is therefore possible by controlling the base voltage.

Such a hot electron transistor has a GaAs/AlGaAs hetero-junction structure which is associated with the following phenomenon. Namely, because in the conduction band of GaAs, a valley (L point) of about 1.7 eV band gap is present above a valley (T point) with the minimum band gap of about 1.53 eV, some hot electrons having an energy level higher than necessary for passing through the collector barrier between the base and collector regions may move into the high level valley which lowers the hot electron speed.

In order to solve this problem, hot electron transistors have been proposed wherein InGaAs having a level difference of 0.5 eV between the T and L valleys in the conduction band greater than GaAs is used as a base layer or the like.

In InGaAs mixed crystals, In and Ga atoms assume random positions in the crystal lattices as the group III elements, resulting in irregularities in the lattice potential. If InGaAs is used as the base region in a hot electron transistor, the probability of scattering hot electrons increases because of these crystal lattice irregularities, thus reducing the collector transfer efficiency and limiting the amplification factor and other parameters.

FIG. 5A is a schematic diagram of the lattice structure of a mixed crystal material grown using conventional techniques. In FIG. 5A, the triangle symbols represent In atoms, the square symbols represent Ga atoms, and the circle symbols As atoms.

In InGaAs mixed crystal semiconductors, although As atoms take positions in the lattice structure as group V atoms, the positions taken by In and Ga Atoms as group III atoms is not definite.

The radius of an In atom is greater than that of a Ga atom. Therefore, the influence of the In atoms in the lattice structure depends upon whether a Ga atom or an In atom takes a particular position as a group III atom. This influence disturbs the regularity of the crystal lattices, resulting in scattering of carrier motion. This indefiniteness of the positions of the group III atoms results in electrically neutral alloy scattering.

In the above description, the indefiniteness of the positions of group III atoms has been explained. Similar alloy scattering also occurs in the case of the indefiniteness of the positions of group V atoms. If the positions of both group III and V atoms are indefinite, additive alloy scatterings occur.

Known scattering mechanisms which limit carrier mobility include phonon scattering, ionized impurity scattering, alloy scattering, and the like. Compound semiconductors such as GaAs are also associated with phonon scattering and ionized impurity scattering.

Alloy scattering is a scattering mechanism specific to mixed crystals. Alloy scattering is essentially less dependent upon temperature than are phonon scattering, ionized impurity scattering, and the like. Alloy scattering thus becomes conspicuous at lower temperatures.

FIG. 5B compares the influence of temperature on electron mobility caused by scattering in an $In_{0.5}Ga_{0.5}As$ crystal as shown in FIG. 5A with the influence of temperature on electron mobility in an ordered mixed crystal of $(InAs)_1(GaAs)_1$ having layer regularity (layer orderliness). The difference is the result of alloy scattering in the FIG. 5A structure. Although the relative amounts of In, As, and Ga in each of these mixed crystals are the same, the ordered mixed crystal $(InAs)_1(GaAs)_1$ has a higher electron mobility because of the absence of alloy scattering. Optical phonon scattering becomes strong at a temperature of about 100° K. and higher. Electron mobility in an ordered mixed $(InAs)_1(GaAs)_1$ crystal is governed almost entirely by optical phonon scattering at temperatures near room temperature, and approaches the mobility of electrons in irregular or disordered mixed crystals.

Semiconductor devices using group III–V compound semiconductor mixed crystal layers as charge carrier transport layers do not exhibit performance enhancement to the degree expected, because of the decrease in electron mobility as a result of the alloy scattering mechanism.

Approaches for providing layer regularity have been proposed. After the report of $(AlAs)_{III}(GaAs)_{II}$ monomolecular layer growth by MBE in 1976 (A. C. Gossard et al., Appl. Phys. Lett. 29 (1976) 323), an $(InAs)_1(GaAs)_1$ monolayer produced by MOCVD was reported by Fukui and an $(AlAs)_{III}(GaAs)_{II}$ monolayer was reported by Ishibashi (T. Fukui and H. Saito: Jpn. J. Appl. Phys. 23 (1984) L521; Ishibashi, et al., Lectures of the Japan Society of Applied Physics, Autumn, 1984, 13a-S-10).

All these approaches used a substrate surface in the (001) plane for layer regularity superlattice growth. An $(InAs)_1(GaAs)_1$ mixed crystal having layer regularity formed on an InP (001) plane was actually observed by electron beam diffraction, x-ray diffraction, or the like (Fukui: Study Report No. 408, Divisions: Solid State Physics and Application, the Japan Society of Applied Physics, (1985) 13).

P. M. Petroff et al. proposed to control the lateral composition by using monolayer steps formed on an off-angle (slightly tilted) substrate having its growth surface tilted at a small angle from the crystal plane of low index (P. M. Petroff et al., Appl. Phys. Lett., 45 (1984) 620), and applied it to monolayer growth of $(AlAs)_{III}(GaAs)_{II}$ by MBE. The two-dimensional composition control of $(AlAs)_{\frac{1}{2}}(GaAs)_{\frac{1}{2}}$ by MOCVD was first reported by Fukui et al. (Fukui et al.: Study Report No. 418, Divisions: Solid State Physics and Application, the Japan Society of Applied Physics, (1987) 13).

In a quantum well structure, a charge carrier can be localized at quantum levels. The localization of quantum levels is improved as the order of the quantum well is raised. A two-dimensional confinement structure for a one-dimensional quantum well is called a quantum wire (one-dimensional electron series), and a three-dimensional confinement structure is called a quantum box (zero-dimensional electron series).

FIGS. 3A to 3C show the quantumized states and the relationships between quantumized energies and state densities p(E). FIG. 3A illustrates one-dimensional quantumization, FIG. 3B illustrates two-dimensional quantumization, and FIG. 3C illustrates three-dimensional quantumization.

For bulk crystals, the parabolic state density function changes to one having a stepwise shape, a sawtooth shape, or a linear shape as shown in FIGS. 3A to 3C, respectively for the one-, two-, or three-dimensional confinement structures.

It is known that the one-and two- dimensional quantumization structures (quantum well structure and quantum wire structure) provide high mobility for charge carrier drift in the non-confined direction because of the suppression of impurity scattering and the simplicity of scattering mechanisms. Thus, these structures are practically applied to some high performance transistors such as HEMT.

It has been pointed out that such quantum size effects have a great influence on the optical performances of group III–V compound semiconductors. For example, high order confinement lasers are expected to have the following desirable characteristics (T. Takahashi and Y. Arakawa, Optoelectronics 3, (1988), pp. 155–163):

(1) low threshold value;
(2) lower temperature dependence for threshold currents;
(3) high resonance frequency of relaxation oscillation, which is an upper limit frequency capable of direct modulation;
(4) narrower oscillation spectrum width; and the like.

Methods for forming such high order confinement structures have been tried conventionally. Some of these methods and their shortcomings are described below.

(a) Combination of lithography and etching

A one-dimensional quantum well structure is first formed, and unnecessary regions are patterned and etched. However, during these processes, the crystal structure at the etched edges may be damaged.

(b) Combination of lithography and selective growth

The confinement structure is selectively grown at patterned regions. However, the size of the structure is governed by lithography precision characteristics so that the minimum size is in the order of 50 nm at best.

(c) Fine region growth using surface steps

The lateral composition is controlled using crystal surface steps formed on a substrate having a surface which is slightly tilted from the (001) plane. This method was first proposed by P. M. Petroff et al., and completed by Fukui et al. providing a $(AlAs)_\frac{1}{2}$ $(GaAs)_\frac{1}{2}$ structure by MOVPE (P. M. Petroff et al., Appl. Phys. Lett., 45 (1984) 620; Takashi Fukui et al., Study Report No. 418, Divisions: Solid State Physics and Application, the Japan Society of Applied Physics, (1987) 13).

FIGS. 4A to 4C schematic diagrams showing directional crystal growth on a substrate provided with steps.

As shown in FIGS. 4A, AlAs is grown on a GaAs substrate having a growth surface that is slightly tilted from the (001) plane. AlAs is first grown laterally from the stepped area. Although atoms on the flat plane of the substrate are attached to the substrate only at their bottoms, atoms at the stepped area of the substrate are attached to the substrate at both their bottoms and sides, thus stabilizing the atom layer attachment. After growing the AlAs layer portion across about one half of the step, a GaAs layer portion is grown on the remaining half of the step as shown in FIG. 4B. After the step is covered with a monomolecular layer, AlAs is again grown. Such a process is repeated to obtain the structure shown in FIG. 4C.

Through the use of the foregoing process damage is eliminated. Moreover, the size of the structure may be reduced by proper selection of the tilted angle of the substrate. Additionally, the in-plane quantum well density may be increased.

A high quality quantum well structure or quantum wire structure may be used in forming ordered mixed crystal layers. If a two-group compound semiconductor is manufactured by alternately laminating two monomolecular layers at a desired ratio, charge carriers drifting in the non-confinement direction are not subjected to alloy scattering, thus providing a crystal having high mobility characteristics and wherein the mean properties (such as band gap and carrier effective mass) of the mixed crystal are maintained in accordance with the laminated ratio.

As shown in FIG. 5B, the ordered mixed crystal $(InAs)_1(GaAs)_1$ has higher electron mobility than the disordered $In_{0.5}Ga_{0.5}As$ crystal. This is attributable to the absence of alloy scattering in the ordered mixed crystal.

The electron mobility of the two crystals differs greatly at temperatures near the temperature of liquid nitrogen. The properties of the ordered mixed crystal are therefore superior to the properties of the disordered mixed crystal.

SUMMARY OF THE INVENTION

It is an object of the present invention to provide a semiconductor crystal growth method capable of growing an ordered mixed crystal efficiently.

It is another object of the present invention to provide a semiconductor device having a novel ordered mixed crystal structure.

It is a further object of the present invention to provide a semiconductor device having an ordered mixed crystal region with reduced carrier scattering.

According to one aspect of this invention, there is provided a semiconductor device comprising at least a region portion located in either a main charge carrier flow region or a subsidiary region adjacent the main region, the region portion having either a two- or three-dimensional superlattice structure, the superlattice structure comprising two or more discrete monomolecular layers of different binary group III-V compounds disposed in periodically ordered relationship in <110> and <001> directions.

According to another aspect of this invention, there is provided a method of manufacturing a semiconductor device comprising the steps of: providing a group III-V compound semiconductor substrate having a surface which is tilted at a predetermined angle a within the range of from 0.5 to 10 degrees from the (110) plane in the <00-1> direction; generating a step having a first edge on said surface; placing said substrate in a crystal growth apparatus; heating said substrate to a predetermined temperature; supplying a vapor phase mixture containing a constituent element of a first binary group III-V compound to said apparatus and growing a first two-dimensional monomolecular layer portion of said first binary group III-V compound at a predetermined ration onto said surface of the heated substrate starting from said first edge of step to thereby present a second edge spaced from said first edge; and growing a second two-dimensional monomolecular layer portion at another predetermined ratio on the step surface starting from said second edge.

According to yet another aspect of this invention, there is provided a semiconductor device comprising: a semiconductor substrate having a tilted surface; and a superlattice structure formed on said surface and having an ordered periodically in the tilted direction, said structure being such that the width of a miniband of the highest energy having an electrons therein is narrower than the energy band of an optical phonon, and the energy of a forbidden band therein between the miniband of the highest energy having electrons and a miniband of the lowest energy without electrons is higher than the energy of the optical phonon.

The regularity is provided for both <110> and <001> directions so that an ordered crystal having a regularity in both two- and three-dimensional directions can be realized. The regularity in the two- or three-dimensional directions allows the band structure to be configured in various ways.

A two- or three-dimensional ordered mixed crystal layer of a binary group III-V compound with its composition controlled in all dimensional directions can be easily obtained with a good reproductivity.

By using such an ordered mixed crystal layer as the active layer, it is possible to provide a high performance semiconductor device such as an HEMT, HET, photodiode, or laser, while suppressing alloy scattering. Optical phonon scattering can also be suppressed.

DETAILED DESCRIPTION OF THE PREFERRED EMBODIMENTS

Figure 6A:
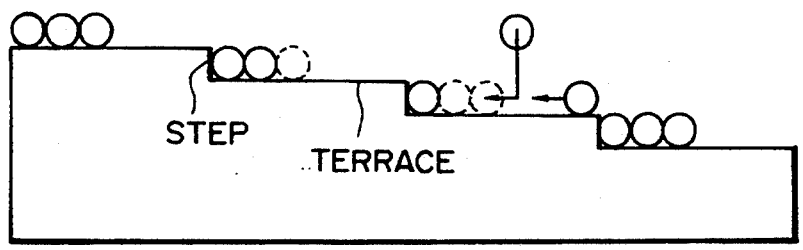
FIGS. 6A to 6C are schematic diagrams in section explaining the crystal growth on terraces.
Figure 6B:
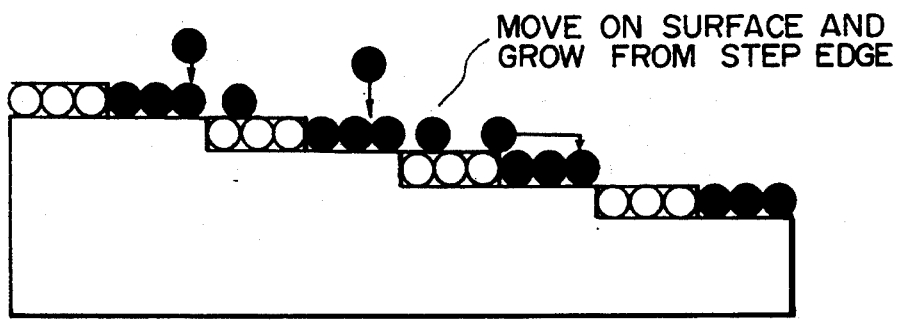
Figure 6C:
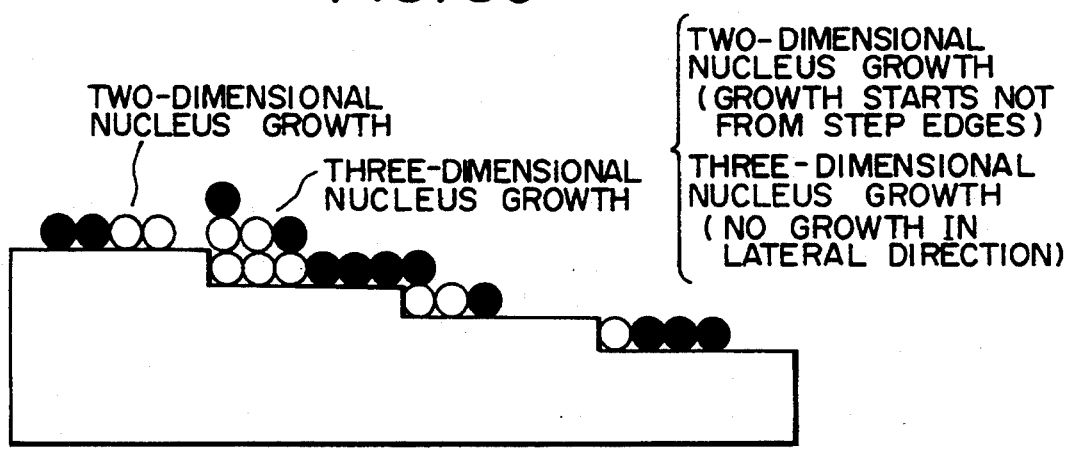

FIGS. 6A to 6C briefly illustrate the process of forming an ordered mixed crystal with a lateral periodicity, on a substrate having surface steps.

First, as shown in FIG. 6A, a desired number of rows of molecules of a first semiconductor monomolecular layer are grown in the lateral direction along each step edge of each terrace. Terraces are formed at an equal pitch on the surface of a substrate tilted from a particular plane.

Next, as shown in FIG. 6B, a desired number of rows of molecules of a second semiconductor monomolecular layer are grown in the lateral direction along the step edge formed by the last row of the first semiconductor monomolecular layer. In this case, if two- or three-dimensional nucleus growth occurs as shown in FIG. 6C, lateral direction periodicity will not be obtained. Two-dimensional nucleus growth occurs when the first and second semiconductor monomolecular layers are mixed. Three-dimensional nucleus growth occurs when a semiconductor monolayer is locally superposed on another monolayer.

All conventional experiments of forming ordered mixed crystals use (001) GaAs or (001) InP as the substrate crystal. From the studies made by the present inventors, the following phenomenon has been found. Namely, during the process of alternately laminating monomolecular layers of two types of binary group III-V compound semiconductors, a localized layer change often occurs when the first type monolayer is laminated upon the second type monolayer, or vice versa, because of natural diffusion or interchange, and layer regularity is quite often disturbed.

Two- or three dimensional nucleus growth is likely to occur when a (001) substrate is used. Such two- or three-dimensional nucleus growth occurs conceivably because of the interchange between upper and lower layer atoms constituting the monomolecular growth layer, or because the monolayer fails to grow along the step edge.

The reproductivity of an ordered mixed crystal growth on the substrate having a (001) plane is therefore lowered, and it becomes difficult to achieve a charge carrier transport layer capable of suppressing alloy scattering.

It is more effective to use a (110) plane substrate rather than a (001) plane substrate in order to form an ordered mixed crystal capable of suppressing alloy scattering.

Figure 7A:
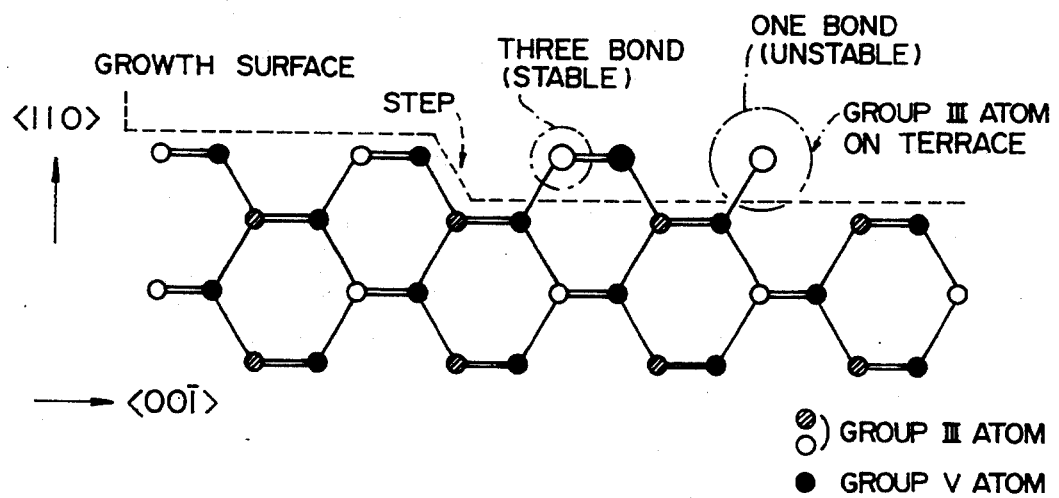
FIGS. 7A and 7B show models explaining different bonds between (110) plane and (001) plane.
Figure 7B:
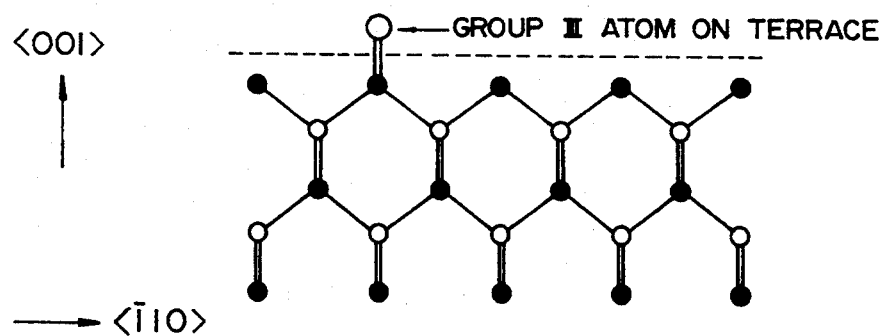

The reason for this is still not clear, but the present inventors believe, as explained in FIGS. 7A and 7B, that the effectiveness of the (110) plane substrate results from the small number of bonds coupling atoms to the (110) plane growth surface, which number is less than the number of bonds coupling atoms to other planes.

FIGS. 7A and 7B are schematic diagrams showing the coupling of atoms on a (110) plane substrate and on a (001) plane substrate. As shown in FIG. 7B, on a (001) plane substrate, each element is coupled by bonds to two atoms of the layer therebelow and to two atoms of the layer thereabove. On the uppermost layer having no layer thereabove, the two upwardly extending bonds are coupled to adjacent atoms of the same species to form a dimer structure.

If the surface has group V atoms, group III atoms attached on the surface are easily coupled by two bonds to group V atoms of the layer therebelow as shown in FIG. 7B. Group III atoms coupled in this manner have a relatively stable state. As a result, the surface mobility of attached group III atoms is reduced, so that these atoms adhere to the terrace at locations other than at the step edge in many cases. This may be the reason for three-dimensional nucleus growth.

If a second compound semiconductor layer to be grown as an underneath first compound semiconductor layer on the (001) plane substrate has a large binding energy, the two bonds of an atom of such layer are disconnected in some cases and this atom is replaced by a group III atoms of a next higher second compound semiconductor layer formed thereon. This may be the reason for two-dimensional nucleus growth.

In contrast, in the case of the growth on a (110) plane substrate as shown in FIG. 7A, when a group III atom in the vapor phase is attached to the surface, such atom couples by one bond to an atom of group V in the layer therebelow so that the binding energy is small. In other words, the surface mobility of group III atoms is large. As a result, group III atoms attached to the terrace are unstable and move easily, and so they are likely to move (to be re-arranged) to the step edge to become stable and adherent to the step edge.

Group III atoms are connected by two bonds, as shown in FIG. 7A, to group V atoms attached on the same terrace, to thereby form a stable group III-V compound molecule. It is therefore conceivable that a monomolecular layer grown on the (110) plane along a step edge has a higher degree of orderliness than does a similar layer grown on the (001) plane.

The present inventors have found that an ordered mixed crystal can be easily grown on a substrate having its plane slightly tilted in the <00-1> direction relative to the (100) plane in particular.

FIGS. 1A to 1D show various periodical structures of monomolecular layers alternately laminated on (110) plane slightly tilted substrates.

Figure 1A:
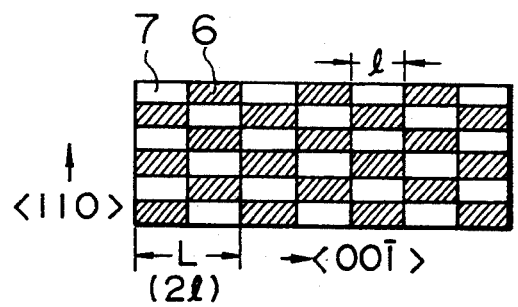
FIGS. 1A to 1D are schematic diagrams showing the periodical structure of alternately laminated monomolecular layers on a (110) plane slightly tilted substrate.

FIG. 1A shows the periodical structure of two types of binary group III-V compound monomolecular layers 6 and 7 alternately laminated on a (110) plane. Steps are formed on the (110) plane surface at a pitch 1. Each monolayer having a period of pitch L in <001> direction is shifted by the pitch 1 in the thickness direction, forming a two-dimensional superlattice (ordered mixed crystal) of a checkerboard pattern.

As viewed from the region of the two-dimensional superlattice within the width 1, two types of binary group III-V compound monolayers are laminated in the thickness direction.

Figure 2A:
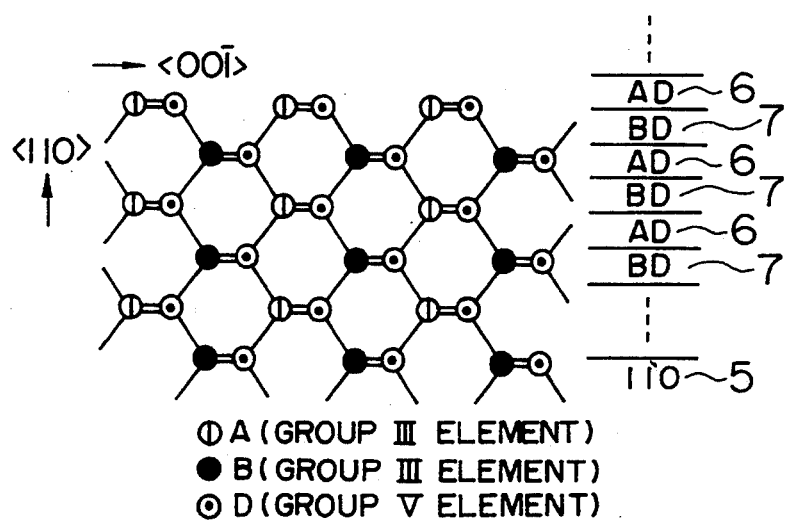
FIGS. 2A to 2C are schematic diagrams explaining a group III-V ordered fixed crystal.
Figure 2B:
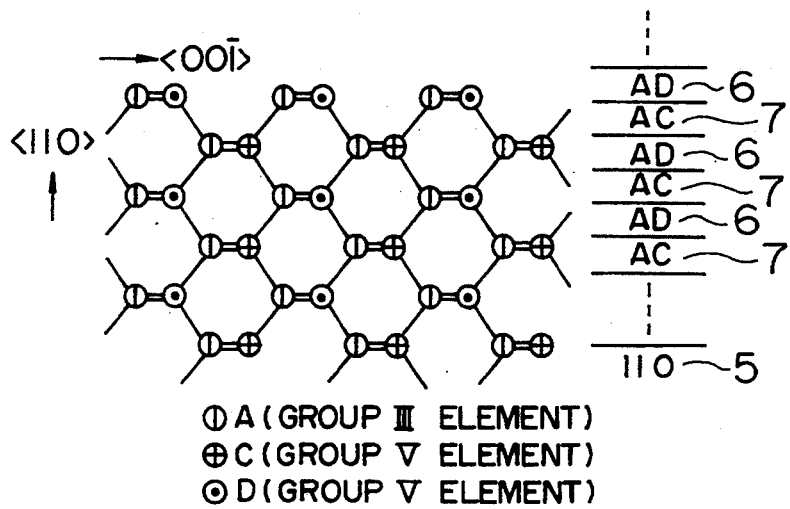
Figure 2C:
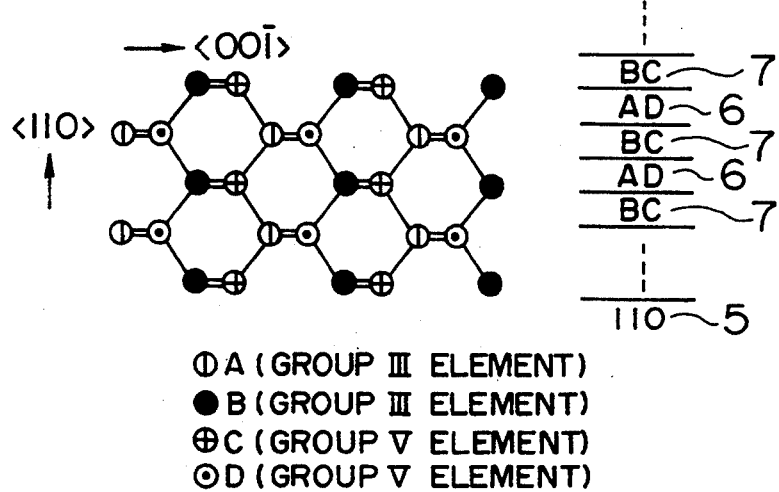
Figure 3A:
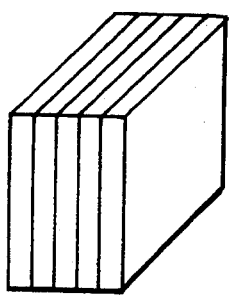
FIGS. 3A to 3C are schematic diagrams explaining one-, two-, and three-dimensional quantumized structures.
Figure 3A:
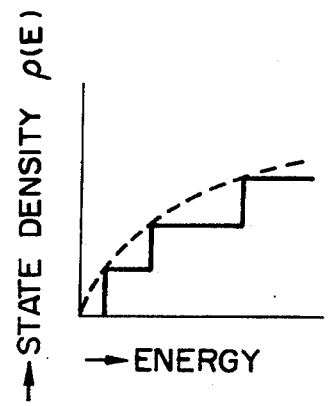
Figure 3B:
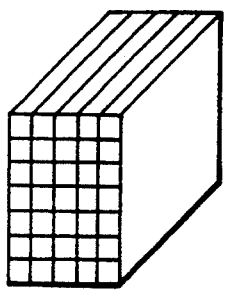
Figure 3B:
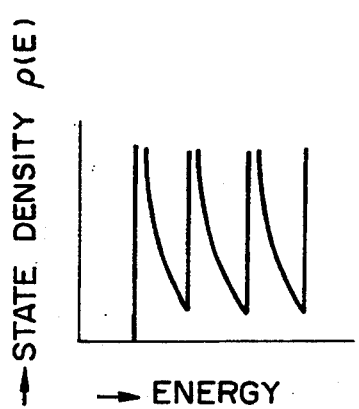
Figure 3C:
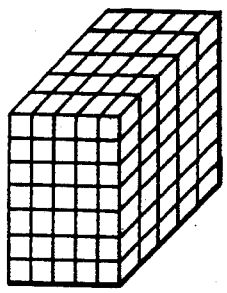
Figure 3C:
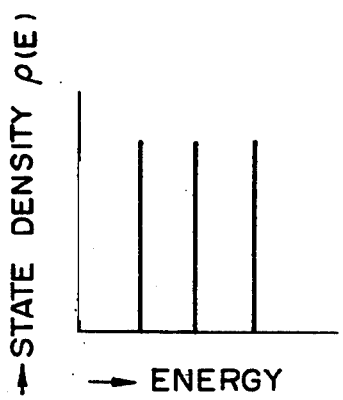
Figure 4A:
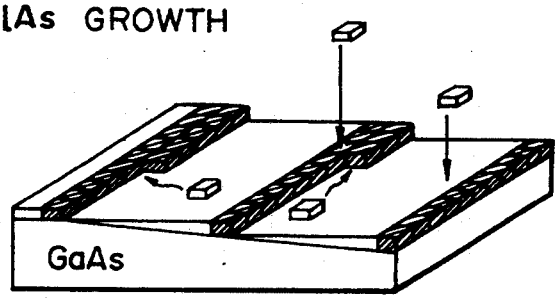
FIGS. 4A to 4C are schematic diagrams in perspective explaining crystal growth on terraces.
Figure 4B:
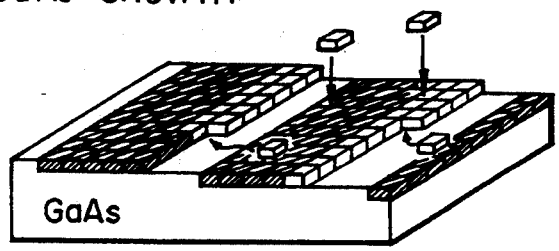
Figure 4C:
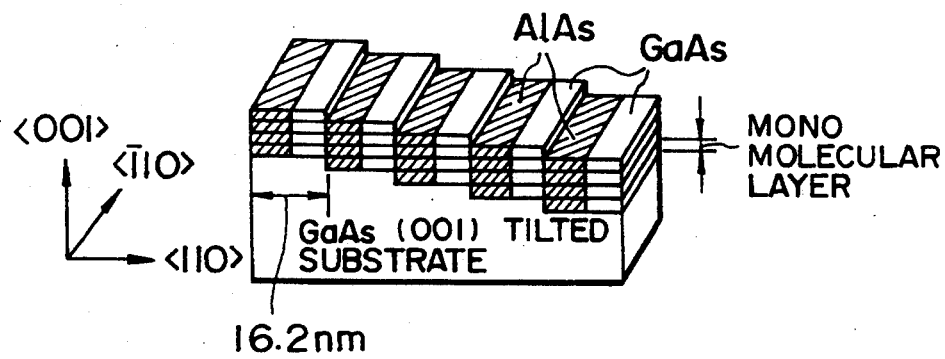
Figures 5A, 5B:
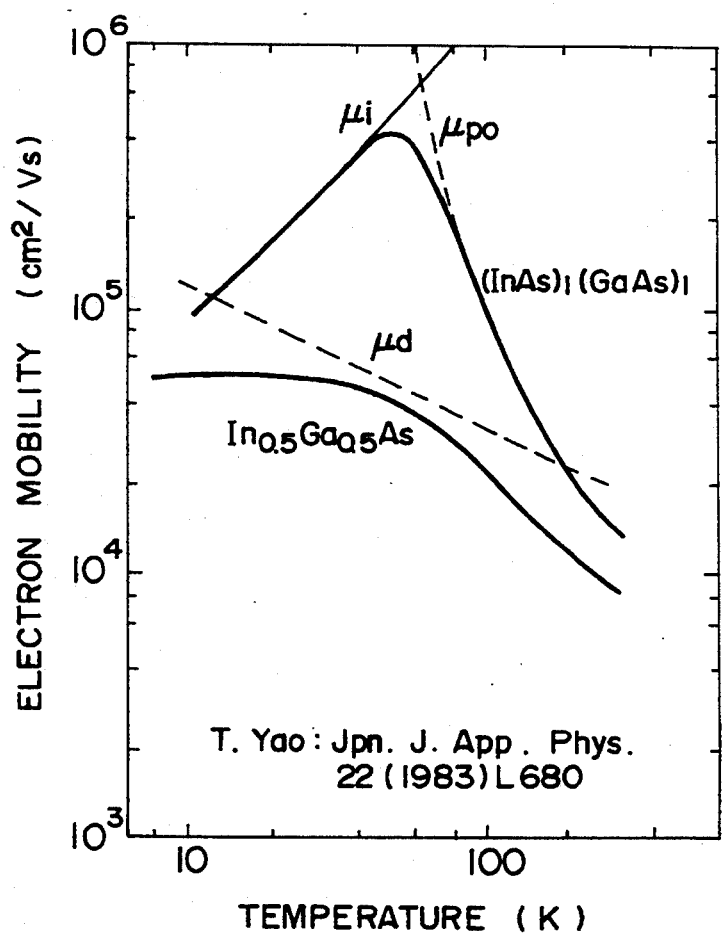
FIG. 5A is a schematic diagram explaining a conventional disordered mixed crystal.
FIG. 5B is a graph showing the temperature dependence of electron mobilities of ordered and disordered mixed crystals.

FIGS. 2A to 2C are schematic diagrams showing ordered mixed crystals at the atom level. A and B represent group III atoms, and C and D represent group V atoms. FIG. 2A shows an inter-group III ordered mixed crystal represented by AD/BD, FIG. 2B shows an inter-group V ordered mixed crystal represented by AD/AC, and FIG. 2C shows an inter-group III-V ordered mixed crystal represented by AD/BC. Although these crystals are compositionally mixed crystals, the atoms therein are disposed in an orderly arrangement.

In FIG. 1A, two types of binary group III-V compound monomolecular layers 6 and 7 are alternately formed in the <110> direction on the (110) plane, and this lamination pattern is repeated in <001> direction at a period L greater than the thickness of two monolayers, to form a two-dimensional ordered mixed crystal pattern. As shown in FIG. 1E, a terrace length 1 is the width (step interval) of a terrace formed on the crystal surface and tilted in the <00-1> direction from the (110) plane by an angle a.

The terrace surface has the (110) plane, and is tilted by the angle a from the (110) plane, with a step height of $d_{220}$ being formed at the pitch 1. The following relationship is therefore satisfied between the terrace length 1, step height of $d_{220}$, and angle a:

$$1 * \tan a = d_{220}$$

In the structure shown in FIG. 1A, two types of monomolecular layers are laminated together forming a periodicity of two monolayers. The period L in the <001> direction is given by:

$$L = 2l$$

where 1 is usually greater than the diameter of one molecule.

Figure 1B:
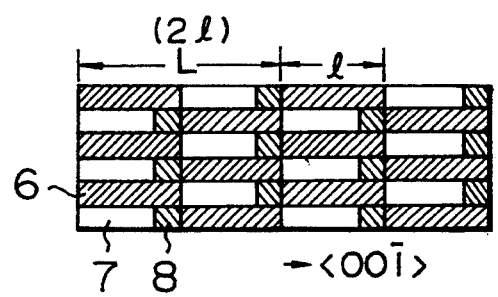
Figure 1C:
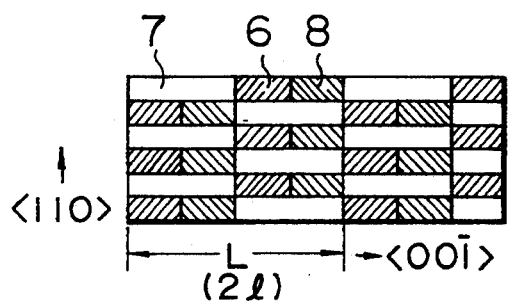
Figure 1D:
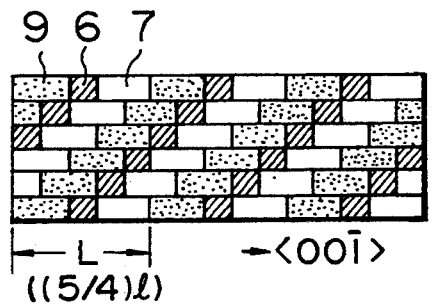
Figure 1E:
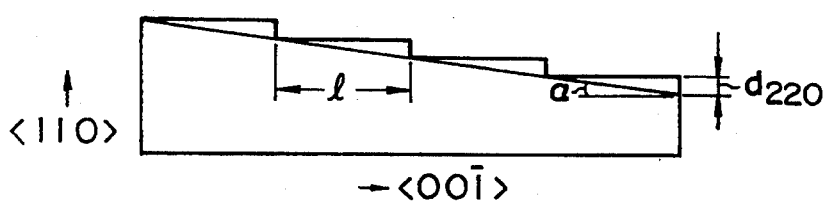
FIG. 1E is a schematic diagram explaining the generation of steps on a slightly tilted substrate.

FIGS. 1B to 1D show other two-dimensional ordered mixed crystals whose periodicity is formed by two monolayers using three or more binary group III-V compound semiconductors formed on a stepped substrate surface.

In the structure shown in FIG. 1B, one type of a monomolecular layer 6 and another type of a monomolecular layer formed by two types of partial or fractional monomolecular layers 7 and 8 are alternately laminated thereon. The boundary between the partial monomolecular layers 7 and 8 is determined independently of each step.

The monolayers 7, 8 and 6 are deposited in the stated order in the <001> direction to form an ordered mixed crystal. In the thickness direction, the monolayers 6, 7 and 8 are laminated in this order to provide a periodicity different from that in the lateral direction.

In the structure shown in FIG. 1B, $L = 2l$, and the relationship between the unit width $l_8$ of the monolayer 8 and the unit widths $l_6$ and $l_7$ of the other two monolayers 6 and 7 within one period in the lateral direction, is given by:

$$l_7 = 3l_8, \quad l_6 = 4l_8,$$

and $$2l = l_6 + l_7 + l_8$$

In the structure shown in FIG. 1C, one type of a monomolecular layer 7 and another type of a monomolecular layer formed by two types of partial monomolecular layers 6 and 8 are alternately laminated to form an ordered mixed crystal. In this case, the following relationships are given:

$$L=2l, \ l_7=l_6+l_8, \ l_6=l_8$$

The ratios of widths or partial monolayers are not limited to those shown in FIGS. 1B and 1C, but optional values may be set.

In FIGS. 1A to 1C, the laminated structure on each terrace is the same in the thickness direction. The monomolecular layer is moved in the lateral direction at each step so that periodicity is generated also in the <001> direction. In the case of alternate lamination of two monolayers, the period in the lateral direction is L=2l. In the case of alternate lamination of three monolayers, the period in the lateral direction is L=3l.

FIG. 1D shows the periodic structure wherein three types of partial monomolecular layers 9, 6, and 7 are sequentially grown on the stepped substrate, with the period being set longer than the terrace width 1 and shorter than 2 L. The layers 9, 6, and 7 grown from each step form one period at the position after the first next substrate step and before the second next substrate step. The periodic pattern in the lateral direction of the structure shown in FIG. 1D is given by:

$$L=(5/4),l, \ l_7=l_9=2l \ _6=(\tfrac{1}{2})l$$

The periodic pattern in the thickness direction shifts in the lateral direction by $(\tfrac{1}{4})l$. With the period in the lateral direction being set to a value other than an integer multiple of l, a periodicity with its pattern progressing to the upper right as shown in FIG. 1D is obtained.

The periodical structure shown in FIGS. 1A to 1D is two-dimensional. If the periodical pattern is formed also in the direction perpendicular to the and <110> and <001> directions (direction perpendicular to the drawing sheet), a three-dimensional carrier confinement structure (quantum box) can be obtained. In this case, the plane of the substrate is tilted in both the <001> direction and in the direction perpendicular to the drawing sheet.

A variety of semiconductor devices may be structured using such ordered mixed crystals. Similar to a general mixed crystal, an ordered mixed crystal can be designed with a desired band gap and refraction factor. With the ordered mixed crystal, alloy scattering can be reduced and the quantumizing effects is to reduce the optical phonon scattering.

Figure 8A:
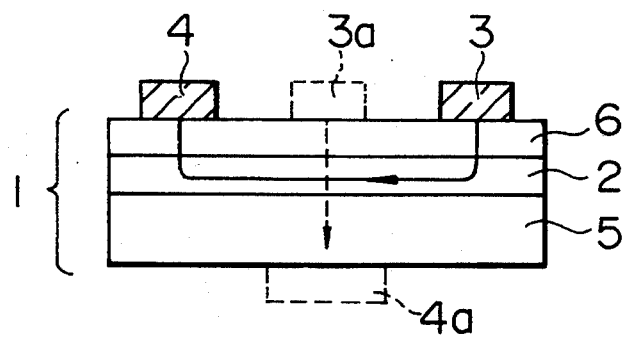
FIGS. 8A and 8B are schematic diagrams in section of semiconductor devices using two- and three-dimensional ordered mixed crystal.

FIG. 8A is a schematic diagram showing the cross section of a semiconductor device 1 which uses a two- or three-dimensional ordered mixed crystal as at least a partial region of the region adjacent to the active region and/or active layer for transporting a charge carrier. Semiconductor layers 2 and 6 are laminated on an underlying crystal 5. Electrodes 3 and 4 for supplying current are formed on the upper semiconductor layer 6. Other electrodes 3a and 3b for supplying current may be formed on the semiconductor layer 6 and the underlying crystal 5. Other control electrodes may also be formed.

At least part of the semiconductor layer 2 and 6 is formed by the above-described ordered mixed crystal. If the current flowing region is formed by an ordered mixed crystal, alloy scattering can be reduced and high mobility can be obtained. In the two-dimensional superlattice structures shown in FIGS. 1A to 1D, if current flows in the <−110> direction perpendicular to the drawing sheet, alloy scattering is reduced by the ordered mixed crystal and the hetero interface is not present in the current flowing direction, so that high mobility can be obtained. Since a superlattice structure is present in the and <110> and <001> directions, the quantumizing effects can be obtained. The minibands by the quantumizing effects may be designed so as not to allow optical phonon scattering. The <001> direction is particularly useful for this purpose. If current flows in the <001> direction, a mobility with reduced optical phonon scattering can be obtained. This is particularly effective for semiconductor devices operating near room temperature.

Ordered mixed crystals have regular lattice positions so that the centers of non-radiative regions can be effectively reduced. In a semiconductor layer or light emitting diode for emitting light from the semiconductor layer 2 or 6 while flowing current between the electrodes 3a and 4a, at least part of the semiconductor layer 2, 6 may be formed using an ordered mixed crystal such as shown in FIGS. 1A to 1D. Using the ordered mixed crystal provides a desired band gap and refraction factor, resulting in a higher mobility and low non-radiative recombination.

Figure 8B:
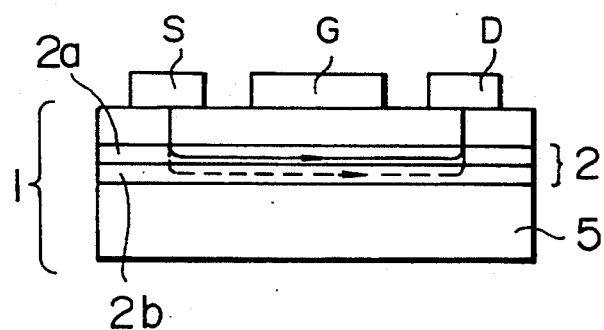

In another semiconductor device shown in FIG. 8B, the underlying crystal 5 is semi-insulating. On this crystal 5, a composite layer 2 is formed which has a two-dimensional ordered mixed crystal upper layer 2a and a disordered (irregular) mixed crystal lower layer 2b of an alloy of the same constituent elements. A charge carrier drift in the region from an electrode S to an electrode D flows into the ordered mixed layer 2a and disordered mixed layer 2b in accordance with an external reverse bias voltage signal applied to an electrode G.

The drift speed of charge carriers in the disordered mixed crystal layers is lowered by the alloy scattering. Therefore, using a field effect transistor as shown in FIG. 8B, a velocity modulation semiconductor device 1 is obtained.

The two- or three-dimensional superlattice structure shown in FIGS. 1A to 1D is obtained by using a substrate having its surface tilted from the (110) plane in the <00-1> direction, or in both the <00-1> direction and in a direction perpendicular to the <00-1> direction, by an angle a within the range of from 0.5 to 10 degrees, and by sequentially supplying limited amounts of source elements of the layers 6, 7, 8 and the like in vapor phase, to grow subsequently predetermined fractions of one monomolecular layer.

In this case, the concentrations of the vapor constituents are controlled so as to grow the monolayer along each step edge and retain a monolayer terrace width (step pitch).

A first type of binary compound semiconductor fractional monomolecular layer is grown on the substrate at a predetermined area by using a predetermined amount of source elements less than one monomolecular layer. After exhausting the used vapor and changing to new vapor, a second type of binary compound semiconductor fractional monomolecular layer is grown by using a second predetermined amount of source elements. A third type of monolayer is grown in a similar manner. The above processes are repeated.

Figure 9A:
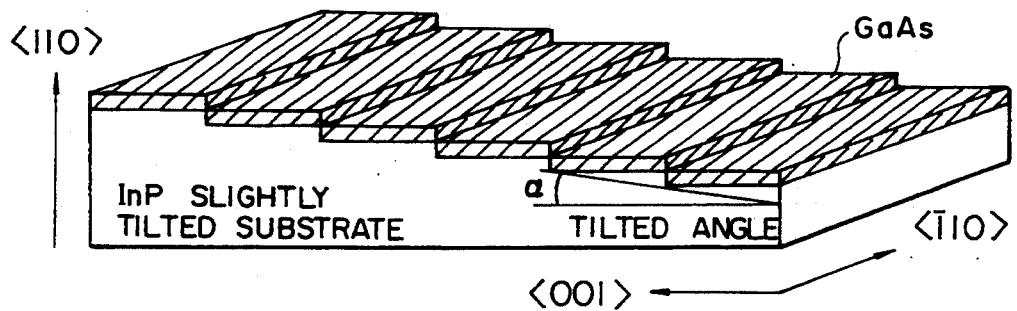
FIGS. 9A to 9C are schematic diagrams in section explaining the formation of a checkerboard pattern superlattice on a slightly tilted substrate.
Figure 9B:
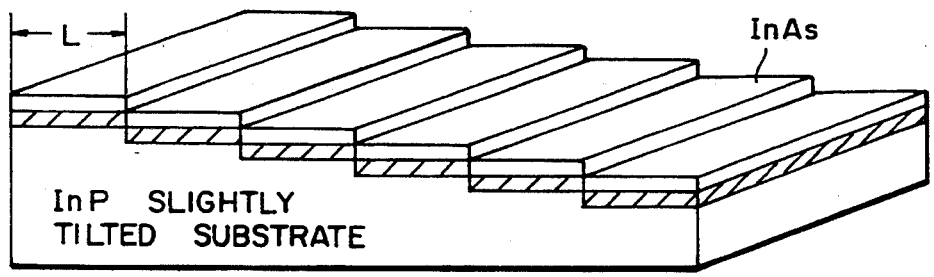
Figure 9C:
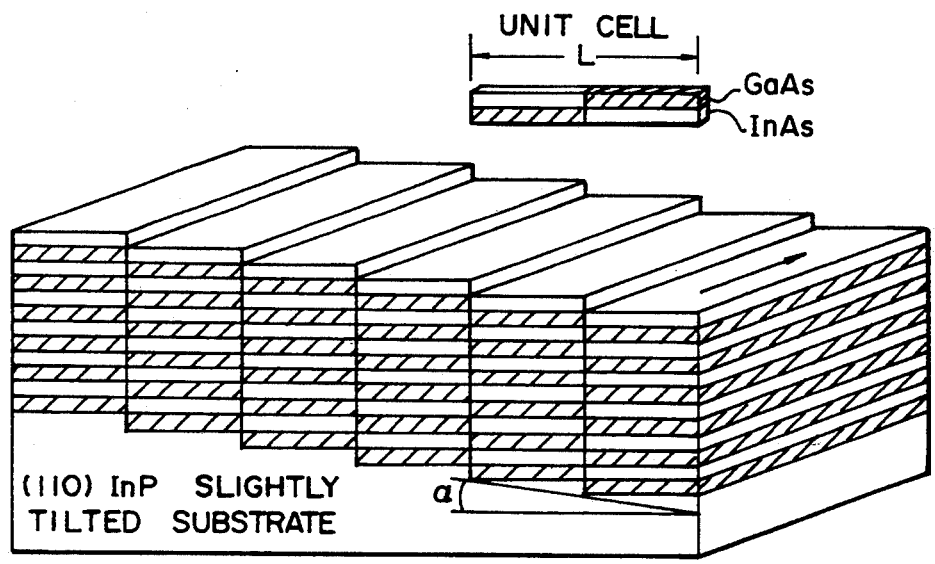

FIGS. 9A, 9B and 9C show how the laminated structure is grown on the substrate. In this example, InAs and GaAs are alternately laminated on an InP substrate. FIG. 9A shows one monomolecular crystal layer of GaAs on the substrate. FIG. 9B shows one monomolecular crystal layer of InAs laminated on the GaAs monolayer. FIG. 9C shows the repetitive lamination of such GaAs and InAs monolayers. GaAs layer and InAs layers are alternately laminated on the (110) plane in the <110> direction, and in addition, GaAs and InAs monolayers are alternately disposed in the <00-1> direction at a predetermined pitch L. The same composition layers continue in the <−110> direction.

The pattern period L in the lateral direction is given as shown in FIG. 1E by the following equation:

$$L = 2d_{220}/\tan a \quad (1)$$

where $d_{220}$ is the height of one monomolecular layer in the <110> direction.

The pattern formed by two different binary compound monomolecular layers may be controlled by observing the reflection high energy electron diffraction (RHEED) at a shallow incident angle. Namely, since the intensity of the electron diffraction differs for each different material, supply material can be changed at a desired position by observing the diffraction intensity.

Figure 10A:
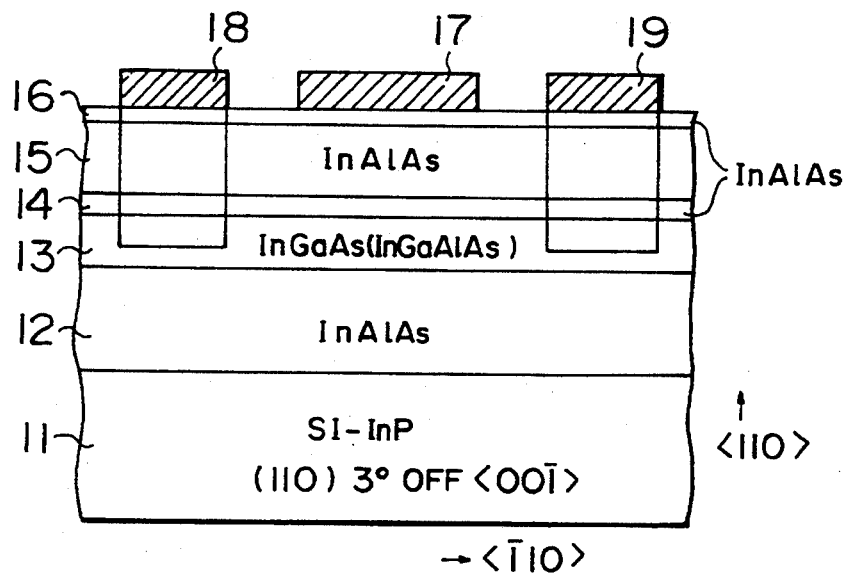
FIGS. 10A to 10C are schematic diagrams in section explaining a HEMT according to an embodiment of the present invention.

FIG. 10A is a schematic diagram showing the structure of a high electron mobility transistor (HEMT) using InGaAs as the channel (electron transport) layer. In this example, on a semiinsulating InP substrate 11 having a crystal plane tilted by three degrees from the (110) plane in the <00-1> direction, an InAlAs buffer layer 12 having a thickness of 350 nm is deposited. In the following discussion, the crystal growth is assumed to be performed by MBE.

During the growth of the buffer layer 12, the substrate temperature was set at 430° C. and the growth rate was set at 0.3 μm/hr. The $In_xAl_{1−x}As$ mixed crystal composition ratio x was gradually changed from 0.52 (at the interface with the InP substrate 11) lattice-matching with the InP substrate to 0.49 lattice-matching with $In_{0.5}Ga_{0.5}As$.

On the buffer layer 12, an electron transport layer 13 of $In_{0.5}Ga_{0.5}As$ or $In_{0.5}Ga_{0.25}Al_{0.25}As$ was formed to a thickness of 50 nm. This electron transport layer (channel layer) 13 was formed as shown in FIGS. 10B or 10C from an ordered mixed crystal having a pattern of alternately laminating monomolecular layers of GaAs and InAs or monomolecular layers of (GaAs and AlAs) and InAs.

Figure 10B:
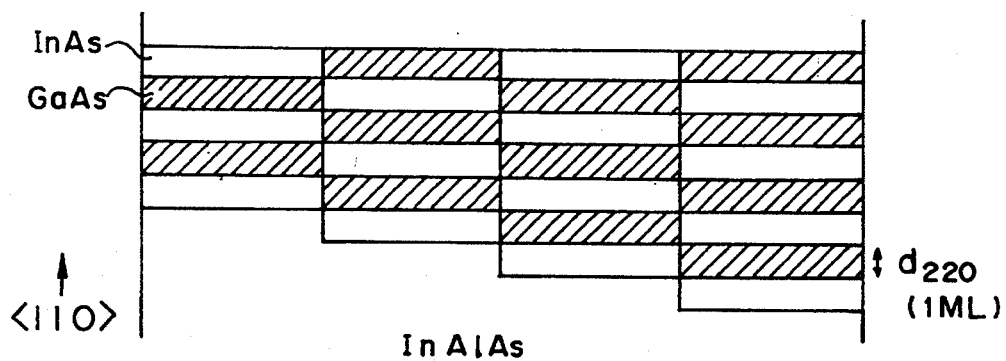
Figure 10C:
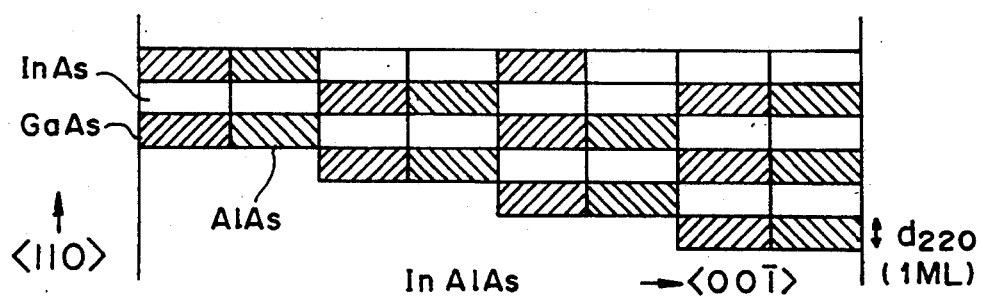

Electrodes were formed so that electrons were transported in the <1-10> direction (direction perpendicular to the drawing sheet of FIGS. 10B and 10C). The crystal orientation is shown indicated in FIG. 10A.

On the electron transport layer 13, an undoped $In_{0.49}Al_{0.51}As$ spacer layer 14 was grown to a thickness of 10 nm. On the spacer layer 14, an $In_{0.49}Al_{0.51}As$ electron supplying layer 15 doped with Si to a concentration of $3*10^{-7}$ atoms/cm$^3$ grown to a thickness of 90 nm. On this electron supplying layer, an undoped $In_{0.49}Al_{0.51}As$ isolation layer 16 was formed to a thickness of 10 nm to complete the compound semiconductor lamination structure.

The MBE beam intensity for obtaining each layer composition was set at $0.9*10^{-7}$ Torr for In, $0.4*10^{-7}$ Torr for Ga., $0.3*10^{-6}$ Torr for Al, $1.1*10^{-7}$ Torr for As (InAs/GaAs monolayer growth), and $2.4*10^{-7}$ Torr for As (InAlAs disordered mixed crystal growth).

The InAs/GaAs monomolecular layer growth in the <110> direction was performed for the case shown in FIG. 10B in the order of from one InAs monolayer (growth time 4.7 sec to one GaAs monolayer (growth time 5.3 sec).

For the case shown in FIG. 10C, the layer growth was performed in the order of from one-half GaAs monolayer, to one-half AlAs monolayer to one InAs monolayer.

Figure 11A:
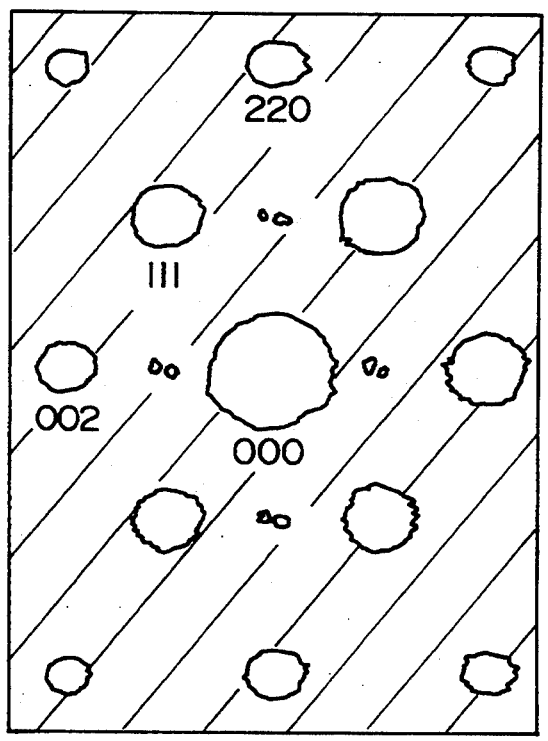
FIGS. 11A and 11B are schematic diagrams showing a transmission electron diffraction image of an ordered mixed crystal and its explanation.
Figure 11B:
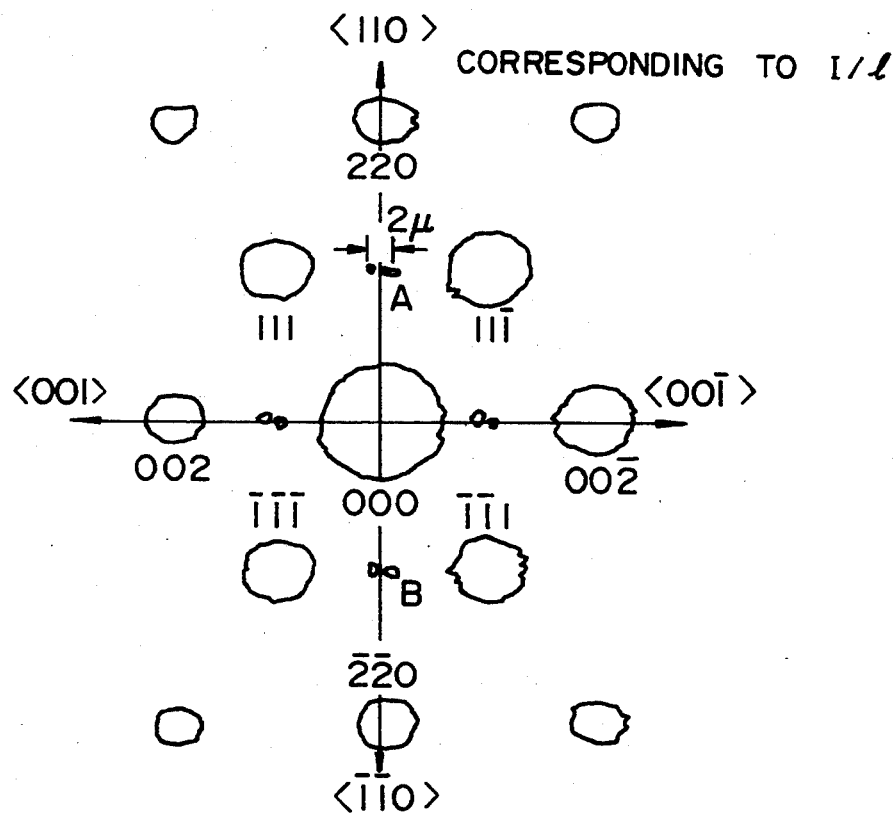

FIG. 11A shows a transmission electron diffraction image of the (1-10) cross section of the superlattice of InAs/GaAs monomolecular layers formed on a substrate tilted by three degrees from the (110) plane in the <00-1> direction. FIG. 11B is a diagram explaining the image shown in FIG. 11A.

The double reflection spots appearing between fundamental reflection points (220) and (000) or between points (002) and (000) indicates the periodic structure of the InAs/GaAs monomolecular layers formed in the <00-1> direction at a width pitch L as shown in FIG. 11B.

Figure 12A:
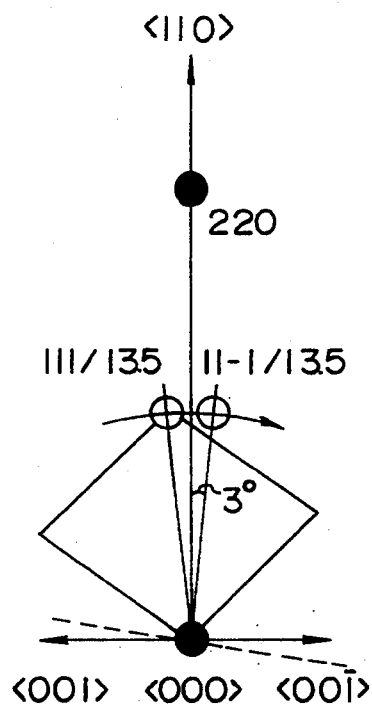
FIGS. 12A and 12B are a schematic diagram explaining X-ray diffraction near (110) and show intensity of X-ray diffraction data.
Figure 12B:
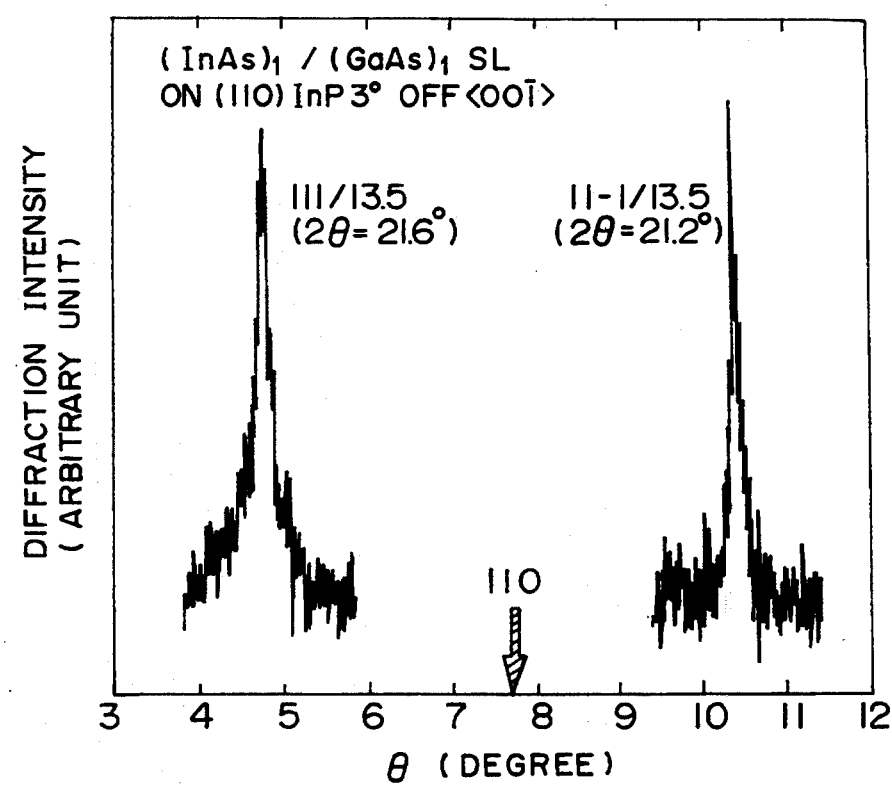

FIGS. 12A and 12B show the X-ray diffraction measurement results near the (110) plane at reflection points of the superlattice. Clearly separated diffraction points were observed also by X-ray diffraction. The diffractions were (111/13.5) and (11-1/13.5).

The distance between separated points in the <001> direction is 6.7a=6.7*5.86=39.3 A (where a is a mean lattice constant of this mixed crystal taking a value 5.86 A). This distance corresponds to the substrate mean stop pitch $1= d_{220}\tan/a = 2.075/\tan 3° = 39.6$ A. It is therefore certain that the periodic structure (L=21) about two times the mean step pitch was formed in the <001> direction.

The structure shown in FIG. 10B was thus confirmed. This group III-V compound semiconductor lamination structure is cut into a predetermined size and the gate electrode 17, source electrode 18, and drain electrode 19 are formed in the <1-10> direction to obtain a final HEMT.

The gate electrode 17 is formed by depositing Al on an isolation layer 16. The source electrode 18 and drain electrode 19 are formed by vapor-depositing AuGe/Au and thereafter performing alloying to move the ohmic contact region to the electron transport layer 13.

This HEMT driven at 77° K. showed a very high transconductance as compared with a HEMT using $IN_{0.5}Ga_{0.5}As$ disordered mixed crystal as the electron transport layer 13.

The electron mobility of a HEMT having a structure as shown in FIG. 10A and including an ordered mixed crystal as shown in FIG. 10B as the electron transport layer was measured.

Figure 13A:
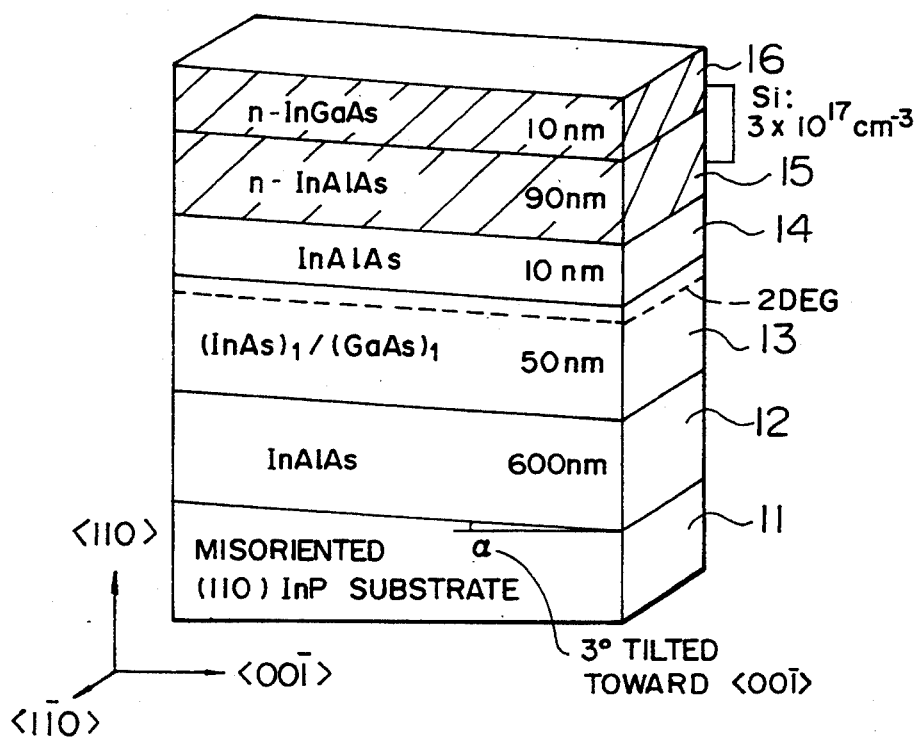
FIGS. 13A and 13B are schematic diagrams in perspective showing a sample used for explaining electron mobility.

FIG. 13A shows the structure of a sample used for the measurement. On an InP substrate 11 slightly tilted by three degrees from the (110) plane in the <00-1> direction, an InAlAs buffer layer 12 was grown to a thickness of about 600 nm. On this layer 12, an $(InAs)_1/(GaAs)_1$ ordered mixed crystal layer 13 was grown to a thickness of about 50 nm. This ordered mixed crystal layer 13 is the electron transport layer.

On the electron transport layer 13, an InAlAs layer 14 was grown as a spacer layer to the thickness of about 10 nm. The above-mentioned layers are all non-doped layers. On the spacer layer 14, an electron supply layer 15 of n-type InAlAs was grown to a thickness of about 90 nm, and on this layer 15, a contact layer 16 of n-type InGaAs was grown to a thickness of about 17 nm. The n-type layers 15 and 16 were doped with Si at a concentration of about $3*10^{17}$ cm$^{-3}$. The crystal orientation was as shown at the lower left in FIG. 13A.

Figure 13B:
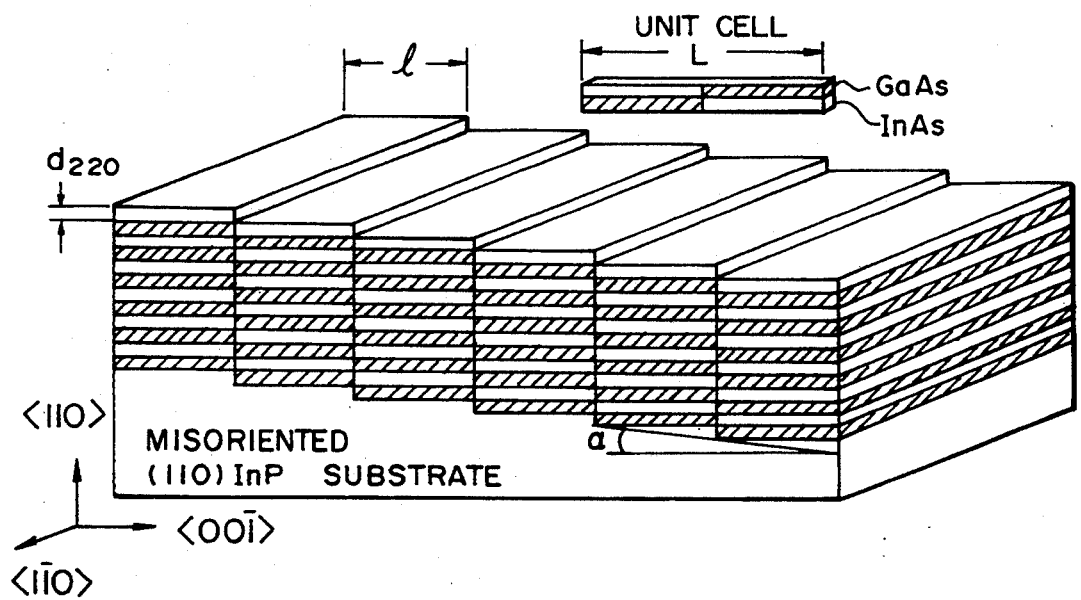

FIG. 13B is an enlarged view of the ordered mixed crystal of the electron transport layer 13. InAs and GaAs are alternately formed in the <110> and <00-1> directions to form a two-dimensional ordered mixed crystal. The period in the <110> direction is $2d_{220}$, and the period in the <001> direction is L=21. Namely, a unit cell is structured by two monolayers in the thickness direction and width L in the lateral direction.

The sample shown in FIG. 13A was mesa-etched to the substrate 11 to provide the configuration for Hall measurement (Hall bar fabrication). The Hall mobility was measured at temperatures from the temperature of liquid helium to room temperature.

Figure 14:
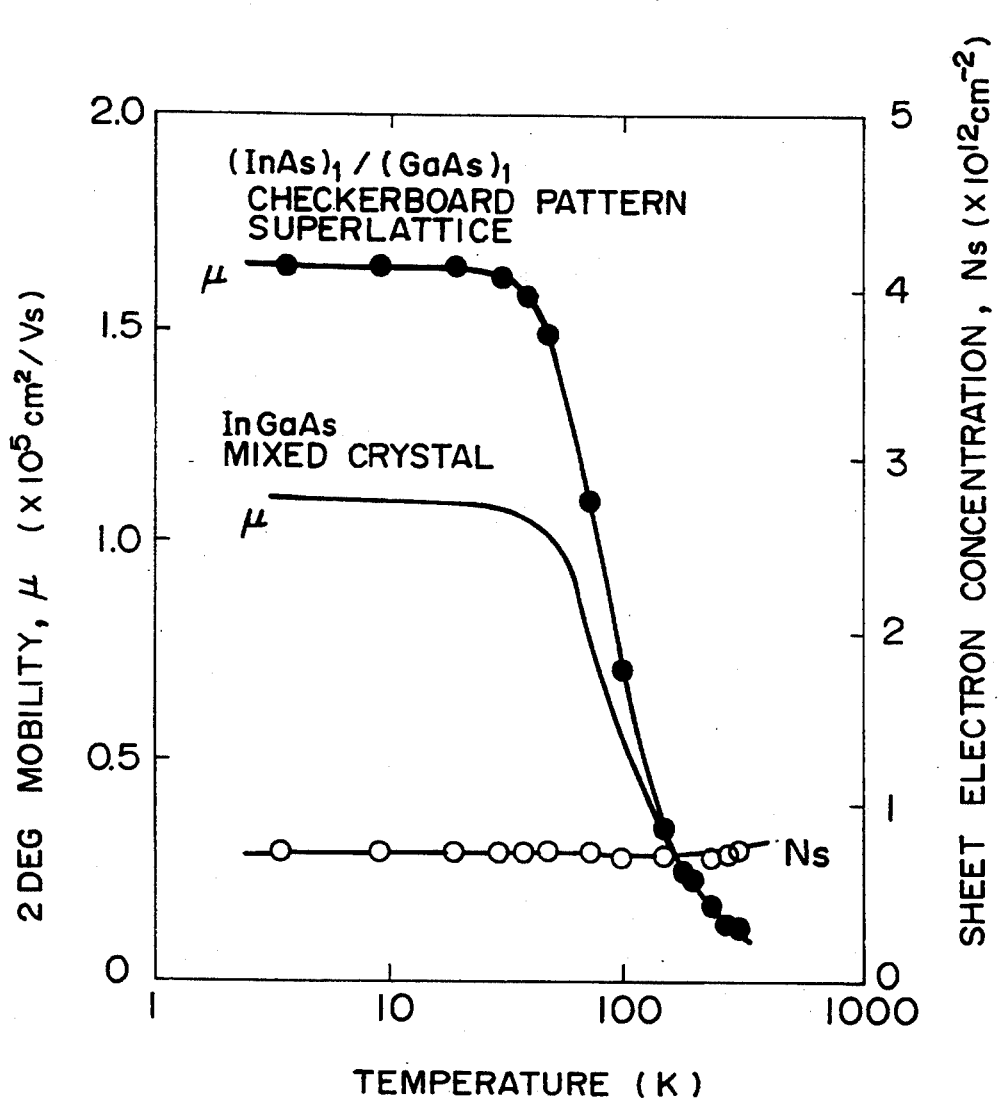
FIG. 14 is a graph showing the measured temperature dependence of electron mobility.

FIG. 14 shows the electron mobilities of the $(InAs)_1/(GaAs)_1$ superlattice of a checkerboard pattern, in comparison with the mobilities of an InGaAs mixed crystal. In the graph of FIG. 14, a sheet electron concentration is also shown.

In the low temperature range from several degrees to several tens of degrees, the mobility of the $(InAs)_1/(GaAs)_1$ ordered mixed crystal takes a value considerably greater than the mobility (calculated value) of the InGaAs mixed crystal. Namely, this graph shows that a mobility not obtainable in a disordered mixed crystal was obtained. Various semiconductor devices can be structured using semiconductor regions having such a high mobility.

The effects of the growth conditions (growth temperature and group V/III supply mole ration) of the InAs/GaAs monomolecular layer superlattice were checked using an InP substrate tilted by three degrees from the (110) plane in the <00-1> direction.

It was found from the RHEED pattern that if the supply mole ratio of group V elements exceeds the proper range, steps are not formed at an equal pitch. It was also found that excessive group III elements generate droplets of group III elements on the surface, thus deteriorating crystal properties.

If the growth temperature is too high, the group V elements vaporize too quickly, resulting in an excess of group III elements and a deterioration of the crystal properties. On the other hand, if the growth temperature is too low, steps are not formed at an equal pitch, resulting in three-dimensional growth. For the growth of InAs/GaAs, InAs/AlAs, GaAs/GaSb, AlAs/GaSb, GaAs/AlSb, AlAs/AlSb, and their mixed crystals InGaAs, InAlAs, InGaAs, GaAsSb, AlAsSb, and InAlGaAsSb, the in-plane periodical structures were formed by using an InP substrate slightly tilted from the (110) plane, and by setting the growth temperature at 350° to 500° C., the mole ration of As to group III element at 5 to 9, and the mole ration of Sb to group III element at 1 to 5.

For the growth of InAs/GaSb, InAs/AlSb, GaSb/AlSb and their mixed crystals InGaAsSb, InAlAsSb, GaAlSb, and InAlGaAsSb, the in-plane periodic structures were formed using an InAs or GaSb substrate slightly tilted from the (110) plane under similar conditions to those described above.

For the growth of GaAs/AlAs, GaP/InP, AlP/InP and their mixed crystals GaAlAs, GaInP, AlInP, and AlGaInP, the in-plane periodic structures were formed using a GaAs substrate slightly tilted from the (110) plane and setting the growth temperature at 500° to 650° C., and the mole ration of group V elements to group III elements at 4 to 8.

The effects of the surface orientation and substrate angle were observed and it was found that an even epitaxial growth is obtained by tilting the substrate at an angle of about 0.5 to 10 degrees from the (110) plane in the <00-1> direction. Such an even epitaxial growth was also obtained for the combinations of substrates other than InP substrate and mixed crystals other than InAs/GaAs.

Figure 15A:
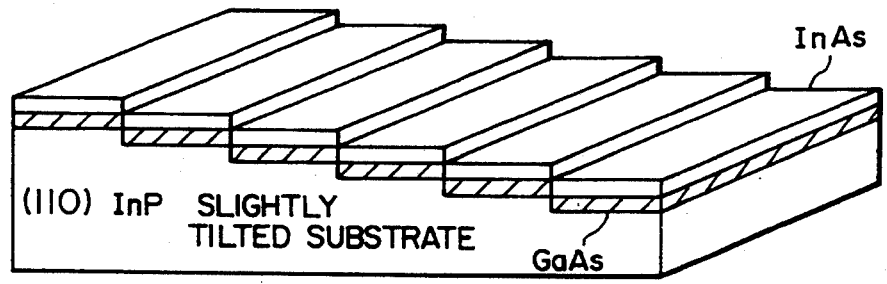
FIGS. 15A to 15C are schematic diagrams explaining the in-situ observation of a superlattice composition by RHEED.
Figure 15B:
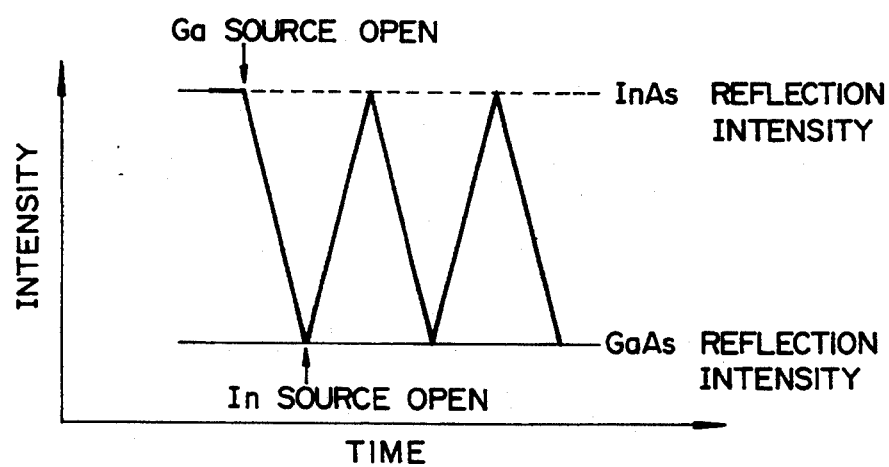
Figure 15C:
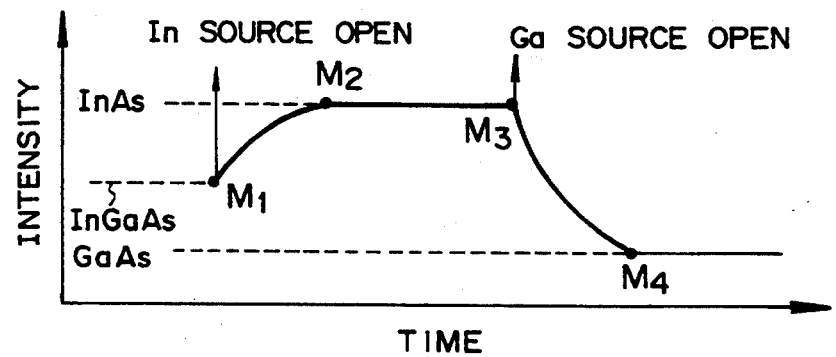

For the two-dimensional ordered mixed crystals such as InAs/GaAs, the width of a monomolecular layer in the lateral direction can be controlled using in-situ observation of RHEED data. FIGS. 15A to 15C illustrate the control method for the InAs/GaAs monomolecular layer superlattice such as shown in FIG. 10B.

As shown in FIG. 15A, while alternately laminating GaAs and InAs on a tilted InP substrate, an electron beam of 10 KeV for example, is applied to the growth surface of the InAs layer at an incident angle of 1 degree. As shown in FIG. 15B, the reflection intensity of the InAs layer is strong and the reflection intensity of the GaAs layer is weak. A low angle beam allows information to be obtained substantially only from the surface (first) layer.

FIG. 15B is a schematic diagram showing the change of the reflection factor during the process of alternately growing InAs and GaAs. During this process, after growing the InAs layer, the supply of an In source is stopped and a Ga source is supplied to grow the GaAs layer, and as the GaAs layer grows, the reflection intensity is lowered gradually. After stopping the supply of the Ga source when GaAs becomes 100%, the supply of the In source is restarted, and as the InAs layer grows, the reflection intensity gradually rises.

A practical method of controlling the lamination of a desired monomolecuar layer is illustrated in FIG. 15C. Specifically, the reflection intensity is first calibrated. The supply of the In source is gradually increased (with zero supply of the Ga source) starting from the position at the reflection intensity $M_1$ corresponding to the mole ratio x between InAs and GaAs in the lateral direction on the surface of the first layer, i.e., corresponding to the composition $(InAs)_x(GaAs)_{1-x}$.

The reflection intensity continues rising to the point $M_2$ at which the whole surface is covered with the InAs layer, and at this point $M_2$ the reflection intensity saturates.

After growing InAs by several monomolecular layers, the supply of the In source is stopped at the point $M_3$ and the supply of the Ga source starts. As the GaAs layer grows, the RHEED reflection intensity continues to decrease. At the point $M_4$, the whole surface is covered with the GaAs layer.

The intermediate point between $M_2$ (or $M_3$) and $M_4$ corresponds to the composition $(InAs)_y(GaAs)_{1-y}$ where y is an arbitrary ratio ($0<y<1$) of InAs. By using the RHEED intensity calibrated by the mixed crystal composition, the ordered mixed crystal ratio can be controlled to a desired value referring to the in-situ observation data.

Figure 16:
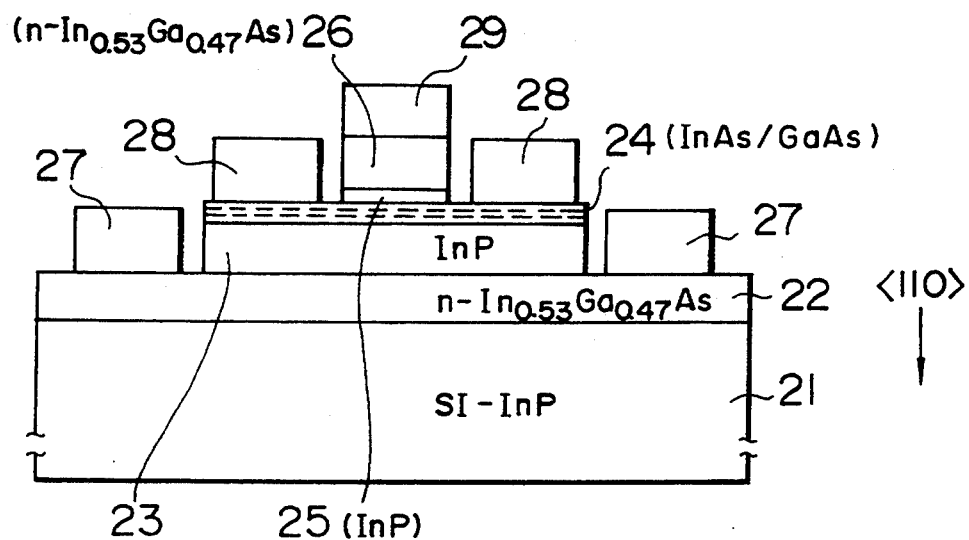
FIG. 16 is a schematic diagram in section of a HET according to an embodiment of the present invention.

FIG. 16 is a schematic diagram of a hot electron transistor using an InAs/GaAs ordered mixed crystal as the base, according to another embodiment of the present invention.

On a semiinsulating InP substrate 21 tilted by three degrees from the (110) plane in the <00-1> direction, a collector layer 22 and a collector barrier layer 23 are formed. The collector layer 22 is made of an n-type $In_{0.53}Ga_{0.47}As$ mixed crystal (disordered mixed crystal), and the collector barrier layer 23 is made of an undoped InP having a thickness of 150 nm. On the collector barrier layer 23, a superlattice base layer 24 is formed which is made of an alternately laminated monomolecular layer InAs/GaAs having a checkerboard pattern as shown in FIG. 1A.

On the base layer 24, an emitter barrier layer 25 and a emitter layer 26 are formed by MBE at a substrate temperature of 430° C. The emitter barrier layer 25 is made of an undoped InP having a thickness of 25 nm, and the emitter layer 26 is made of an n-type $In_{0.53}Ga_{0.47}As$ mixed crystal.

The base layer 24 of this embodiment is of a monomolecular layer superlattice structure of InAs and GaAs, and is doped with, for example, about $0.5 * 10^{18} cm^{-3}$ of Si as the donor impurity.

The thickness of the base layer 24 is 50 nm for example. Collector electrodes 27, base electrodes 24, and an emitter electrode 29 are formed on the collector region 22, base region 24, and emitter region 26, respectively. The collector electrodes 27 and base electrodes 28 are, for example, an AuGe alloy layer about 20 nm thick and an Au layer about 280 nm thick. The emitter electrode 29 is, for example, an AuGe layer about 20 nm thick, an Au layer about 100 nm thick, and a WSi layer about 30 nm thick.

The base region 24 has orderly disposed group III atoms, so that the potentials are periodic in this region and alloy scattering is reduced.

The emitter barrier layer 25 has been described as being made of InP. Instead, this region may be made of an InAlAs mixed crystal. This region may also be made of an alternate monomolecular layer (ordered mixed crystal layer) of InAs/AlAs. In this case, alloy scattering is suppressed also within the emitter barrier, providing better effects.

The influence of crystal lattices disturbances propagates to nearby regions. If the mixed crystal region exists near the carrier transport region, scattering can be expected to be reduced by forming such nearby region of an alternate monomolecular lamination layer.

In the above discussion, the group III-V mixed crystal semiconductor is described as containing two types of group III elements. Scattering may also be suppressed in a group III-V semiconductor containing two types of group V elements.

On an InP substrate tilted by five degrees from the (110) surface in the <00-1> direction, a GaAs/GaSb ordered mixed crystal is grown by MBE at a growth temperature 500° C. The transmission electron diffraction image of this ordered mixed crystal is approximately the same as that shown in FIG. 11A.

It has been found that a monomolecular layer (checkerboard) superlattice of GaSb/GaAs can be easily formed in the growth direction and in the lateral direction, providing a periodic structure. Such an alternate monomolecular lamination layer of GaSb/GaAs may be used as at least part of a carrier transport region or region adjacent thereto. Reduction of alloy scattering can be expected because of the elimination of irregularities or disorder.

Figure 17:
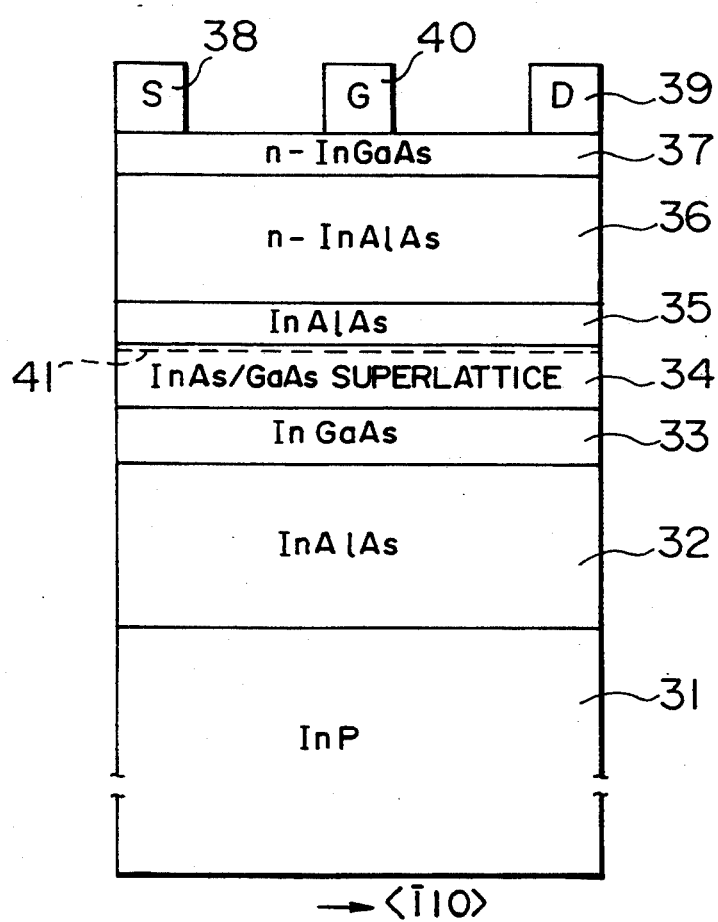
FIG. 17 is a schematic diagram in section showing a velocity modulation field effect transistor according to an embodiment of the present invention.

FIG. 17 is a schematic diagram showing the structure of a velocity modulation field effect transistor according to another embodiment of the present invention.

In FIG. 17, the electron transport layer is made of two layers. As the first electron transport layer 34 having a higher electron mobility, a two-dimensional ordered mixed crystal InAs/GaAs superlattice layer having the lamination (or checkerboard) pattern shown in FIG. 1A is used. As the second electron transport layer 33 having a lower electron mobility, an $In_{0.5}Ga_{0.5}As$ disordered mixed crystal layer is used.

On a semi-insulating InP substrate 31 tilted by five degrees from the (110) plane in the <00-1> direction, an undoped InAlAs disordered mixed crystal buffer layer 32 of 5000 A is formed. On this buffer layer 32, an undoped $In_{0.5}Ga_{0.5}As$ disordered mixed crystal layer of 3000 A is formed as the second electron transport layer 33. On this layer 33, an InAs/GaAs monomolecular superlattice layer having a thickness of 200 A is laminated as the first electron transport layer 34.

The monomolecular superlattice layer is made of about seventy layers. On this layer, an undoped InAlAs disordered mixed crystal layer having a thickness of 900 A is formed as an electron supply layer 36. On this layer 36, an n-type InGaAs disordered mixed crystal layer having a thickness of 100 A is deposited. These layers are continuously formed by MBE at a substrate temperature 440° C.

Formed on the contact layer 37 are a source electrode 38 and drain electrode 39 in ohmic contact with the contact layer 37 and a gate electrode 40 in Schottky contact with the contact layer 37.

The operation of this semiconductor device is described hereinafter.

While no voltage is applied to the gate electrode 40, electrons supplied from the electron supply layer 36 to the two-dimensional electron gas layer (2 DEG) 41 on the upper surface of the first electron transport layer 34, i.e., an interface between the spacer layer 35 and the InAs/GaAs superlattice layer 34, are transported within the first electron transport layer 34 in the <-110> direction, providing a very high mobility such as is shown in FIG. 14. When a negative voltage is applied to the gate electrode 40, the depletion layer extends under the spacer layer 35 and electrons in this region are moved downwardly. As a result, the gas layer 41 is moved to within the second electron transport layer 33 where alloy scattering becomes conspicuous, and electron mobility is decreased.

By applying an external voltage changing with time to the gate electrode 40, the electron transport region is switched between the regions 33 and 34. In this manner, electron mobility can be modulated. A minute change $\Delta gm$ of the transconductance gm is given by:

$$\Delta gm = n * \mu \quad (2)$$

The number of transporting electrons per unit time can be changed by changing the carrier transport velocity without changing the number n of carriers flowing through the electron transport layer. The restriction caused by the carrier transport time, i.e., electron mobility, can be eliminated, providing an expected high speed operation (Y, Sasaki: JJAP 21 (1982) L381).

The semiconductor device shown in FIG. 17 thus operates as a velocity modulation field effect transistor having a high transconductance gm. Like FETs generally, in this velocity modulation FET the number of carriers drifting in the electron transport layer changes with the gate voltage. However, $\Delta n$ functions to enhance the velocity modulation effects, thereby increasing the transconductance gm.

Figure 18:
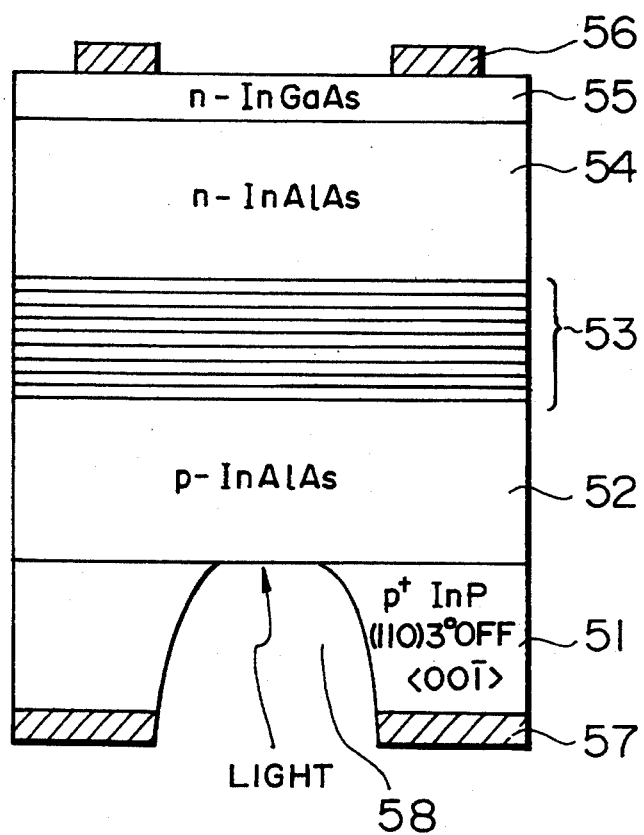
FIG. 18 is a schematic diagram in section showing an avalanche photodiode according to an embodiment of the present invention.

FIG. 18 is a schematic diagram in section showing the structure of an avalanche photodiode (APD) according to another embodiment of the present invention. On a Zn doped p+-type InP substrate 51 tilted by three degrees from the (110) plane in the <00-1> direction, group III-V compound mixed crystal layers are laminated by MBE.

First, a Be doped p-type $In_xAl_{1-x}As$ buffer layer 52 is grown to the thickness of about 1 μm on the substrate 51. The buffer layer 52 may be formed using a general disordered mixed crystal. The ratio x is gradually changed from a value of x=53 providing lattice-matching with the interface with the InP substrate 51 to a value of x=0.50 forming a gradually changing composition layer. The carrier concentration is about $1 * 10^{18}$ cm$^{-3}$.

On the p-type buffer layer 52, a carrier multiplication layer 53 of a superlattice structure is formed. This multiplication layer 53 is formed by alternately laminating an InAs/GaAs alternate monomolecular layer and an InAs/AlAs alternate monomolecular layer. The thickness of the InAs/GaAs alternate monolayer is 40 nm, and the thickness of the InAs/AlAs alternate monolayer is 30 nm.

In the carrier multiplication layer 53, alloy scattering is suppressed because of ordered atom positions. Therefore, the ionization ratio (carrier multiplication ratio) during the avalanche breakdown upon reception of light is greater than when a disordered mixed crystal is used.

On the carrier multiplication layer 53, a Si doped n-type InAlAs clad layer 54 is formed to the thickness of 1 μm. On the clad layer 54, a Si doped n-type InGaAs cap layer 55 is formed to a thickness of 100 nm. The doping level of Si is about $1 * 10^{18}$ atoms/cm$^3$, and the clad and cap layers 54 and 55 are made of general disordered mixed crystals.

A light reception recess 58 is formed by locally etching the substrate 51 up to the buffer layer 52. A ring-shaped Au/AuGe film is vapor-deposited as an n-layer side electrode 56 on the cap layer 55. A ring-shaped AuSn film is vapor-deposited as a p-layer side electrode 57 on the InP substrate 51 outside of the recess 58.

When a reverse voltage is applied across the n-layer side electrode 56 and p-layer side electrode 57 and light of 0.8 μm wavelength is applied, the incident light is absorbed by the p-type InAlAs buffer layer 52.

Of the charge carrier thus generated, electrons are biased to drift in the carrier multiplication layer 53, and new electron-hole pairs are generated by the avalanche effects.

The avalanche multiplication factor is represented by an exponential function of an applied electric field. In the carrier multiplication layer 53 of the superlattice structure of this embodiment, the conduction and valence band energy discontinuities $\Delta_c$ and $\Delta E_v$ between the InAs/GaAs monomolecular layer superlattice and InAs/AlAs monomolecular layer superlattice are added to the reverse bias electric field, thus raising the multiplication factor more than a bulk crystal. Furthermore, since there is no alloy scattering, a higher ionization factor can be obtained which is three to five times as high as when generally using disordered mixed crystals.

Figure 19A:
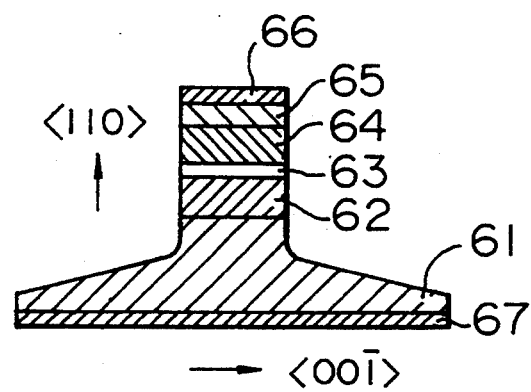
FIGS. 19A and 19B are schematic diagrams in section showing a semiconductor laser according to an embodiment of the present invention.

FIG. 19a shows a semiconductor layer having a superlattice active layer of a periodical composition structure in the lateral directions.

On an n$^+$-type InP substrate 61 tilted by one degree from the (110) plane in the <00-1> direction, semiconductor layers shown in FIG. 19A are continuously grown by MBE. First, on a substrate 61, a Si doped (n=5 * 10$^{10}$ cm$^{-3}$) n-type InAlAs clad layer 62 is grown to a thickness of about 2 μm. This layer is a general alloy type disordered mixed crystal layer.

Figure 19B:
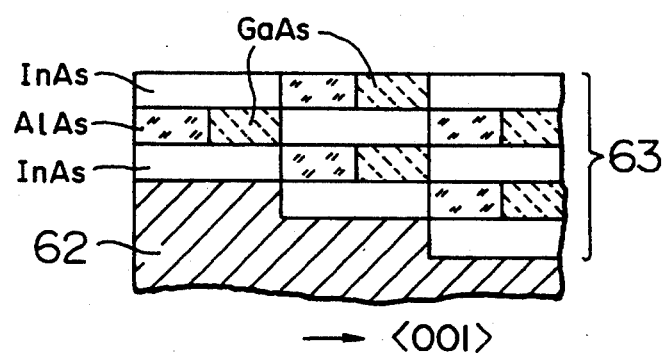

Next, on the clad layer 62, a superlattice active layer 63 having an alternate monomolecular layer pattern such as shown in FIG. 19B is grown. This active layer 63 is grown in order of one InAs monolayer, one-half AlAs monolayer, and one-half GaAs monolayer, and has the thickness of about 60 A.

The growth temperature is set to 420° C., and the group III elements supply concentration is reduced in order to raise the mobility of atoms attached to the surface. As a result, the growth rate is lowered considerably to about 0.1 μm/hr (one monolayer growth in 7.5 seconds).

Next, on the superlattice active layer 63, a Be doped (p=5 * 10$^{10}$ cm$^{-3}$) p-type InAlAs clad layer 64 is grown to a thickness of about 1 μm. On the clad layer 64, a Be doped p$^+$-type InGaAs contact layer 65 is grown to a thickness of 0.1 μm.

After vapor-depositing Au/AuGe as a p-layer electrode 66 and AuSn as a n-layer electrode 67, a mesa process (ridge process) is performed to provide a stripe in the <1-10> direction as shown in FIG. 19A and complete a finished laser device. The width direction of the stripe is in the <00-1> direction.

The active layer of the laser device shown in FIG. 19A has a quantum wire structure with its ordered mixed crystal extending in the <00-1> direction.

Light and carriers are confined within the active layer 63 by the upper and lower clad layers 62 and 64, and are also confined in the lateral direction by the InAlAs ordered mixed crystal. The carriers and light are confined within the quantum wire region of the InGaAs ordered mixed crystal (superlattice) having a cross area of about 60 * 60 A$^2$.

The recombination light emission within the InGaAs ordered mixed crystal (superlattice) has a narrow spectrum width because of transitions between quantumized levels, has a stable radiation wavelength because of mixed crystal composition fluctuation to be caused of mixed crystal composition fluctuation to be caused by clusters, and can oscillate at a low threshold value with a high peak gain.

Figure 20:
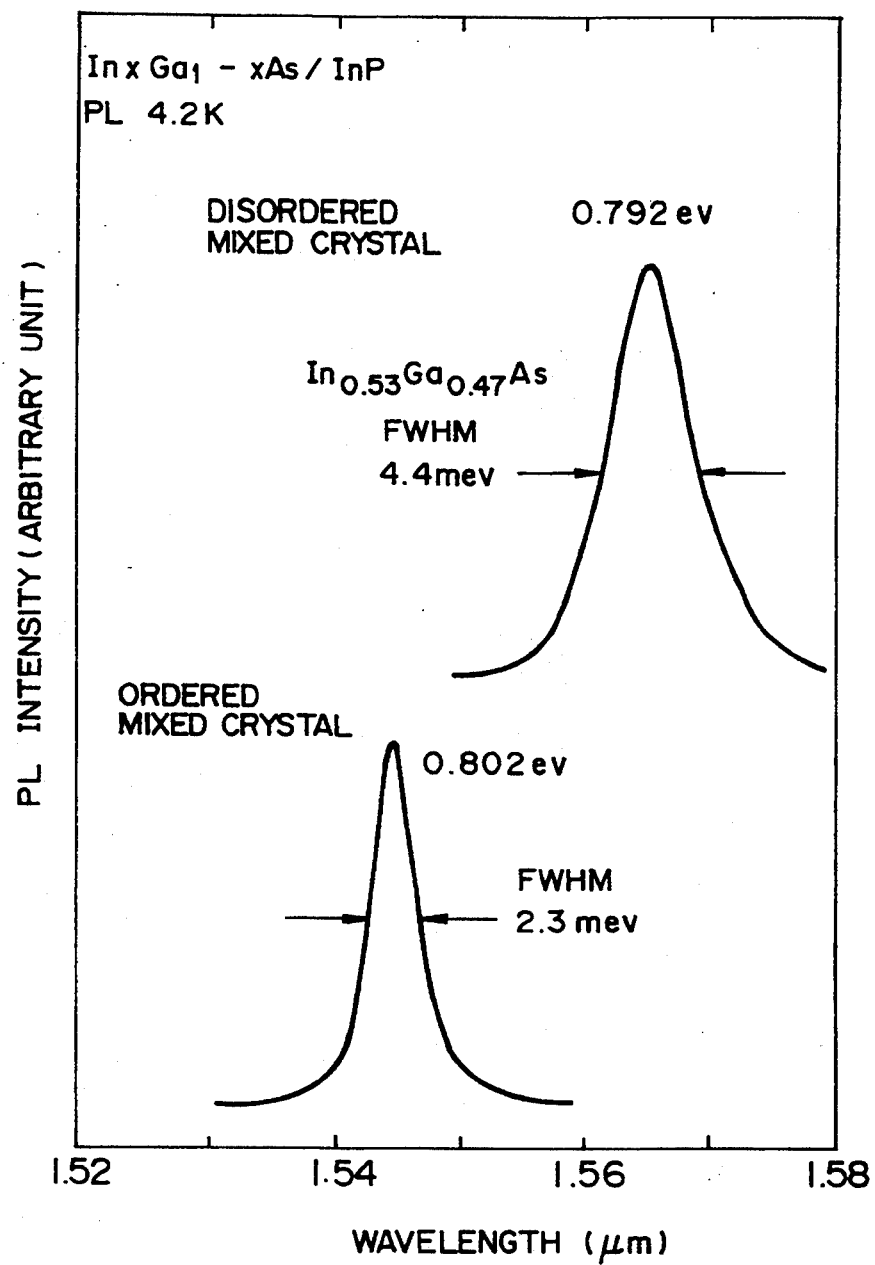
FIG. 20 is a graph comparing photoluminescence data of an ordered mixed crystal according to the present invention with photoluminescence data of a disordered mixed crystal.

FIG. 20 shows a radiated light (photoluminescence) spectrum obtained from an InGaAs disordered mixed crystal and an InAs/GaAs alternate monomolecular layer superlattice, i.e., an InGaAs ordered mixed crystal. The measurement of photoluminescence was made at 4.2° K. The upper radiated light spectrum shown in FIG. 20 was obtained from an In$_{0.53}$Ga$_{0.47}$As disordered mixed crystal on the (100) InP substrate.

The lower radiated light spectrum shown in FIG. 20 was obtained from an InAs/GaAs alternate monomolecular layer (In$_{0.53}$Ga$_{0.47}$As ordered mixed crystal) on the InP substrate tilted by three degrees from the (110) plane in the <00-1> direction. It is to be noted that the full width at half maximum (FWHM) of the ordered mixed crystal is narrowed to one-half that of the disordered mixed crystal. The shift between both the peak wavelengths indicates the composition difference.

The semiconductor laser shown in FIG. 19A is a communication laser for radiating light having a wavelength of 1.5 μm. The invention is not limited to such a semiconductor laser, but other application fields may be possible such as a 0.98 μm laser for light amplification in Er doped fiber, by positively utilizing a low threshold value, stable oscillation wavelength, high peak gain, narrow spectrum, temperature stability, and high current density at the start of chirping.

In the above-described embodiments, a two-dimensional ordered lattice is formed on an underlying stepped crystal, and a carrier is transported in the direction without periodicity or in the depth direction (periodicity: two monomolecular layers). In the in-plane periodicity direction, a superlattice is formed whose properties depend on the constituent elements and the periodical structure. A desired band structure can be designed by using the superlattice so that a carrier can be transported in the in-plane periodicity direction to obtain a desired function.

FIGS. 21A to 21D show manufacturing steps for a high electron mobility semiconductor transistor.

In FIGS. 21A to 21D, the reference numeral 71 represents an InP tilted substrate, reference numeral 72 represents a terrace, reference numeral 73 represents a step edge, reference numeral 74 represents an InAs monomolecular layer, reference numeral 75 represents a GaAs monomolecular layer, reference numeral 76 represents an InAs monocrystal layer, and reference numeral 77 represents a GaAs monocrystal layer.

Figure 21A:
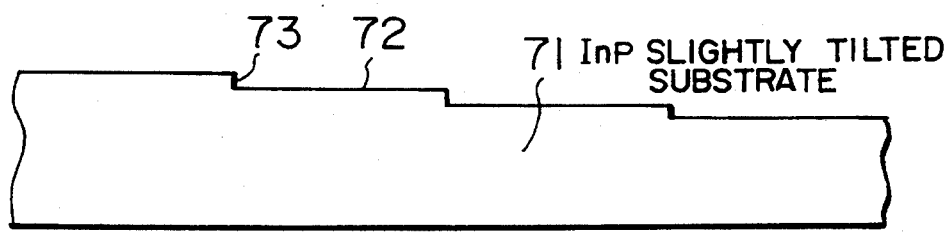
FIGS. 21A to 21D are schematic diagrams in section explaining the manufacturing steps of a HEMT according to an embodiment of the present invention.

As shown in FIG. 21A, an InP substrate 1 is prepared which is tilted by 1.5° from the (110) plane in the <00-1> direction.

The tilt from the (110) plane in the <00-1> direction determines the width of a terrace. It is therefore preferable to use a substrate tilted by 2° or greater in order to form a fine lattice sufficient for providing the quantum effects.

Figure 21B:
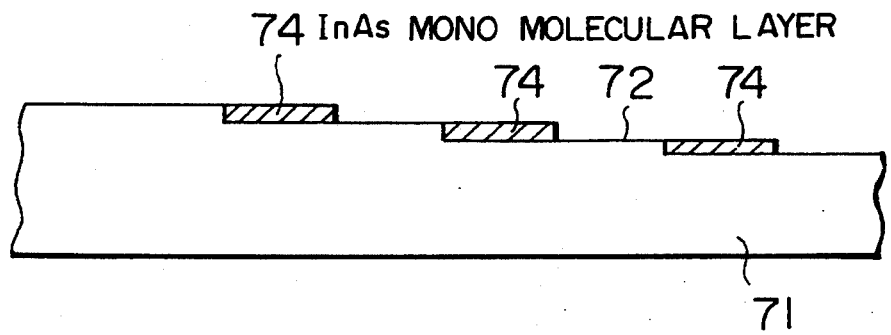

Next, as shown in FIG. 21B, an InAs monomolecular layer 74 is grown on the tilted InP substrate 71 by MBE, starting from the step edge 73 so as to cover one half the step width.

With this growth method, the InAs monolayer 74 grows on the terrace of the tilted InP substrate 71 starting from the step edge 73.

Figure 21C:
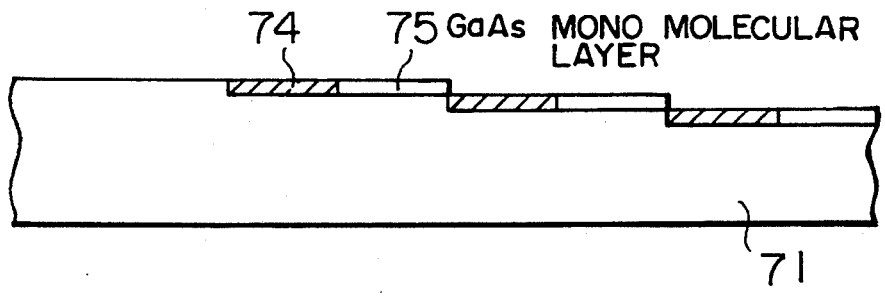

Next, as shown in FIG. 21C, the source is changed to grow a GaAs monomolecular layer 75 on the terrace 75 for the remaining half of the step.

Figure 21D:
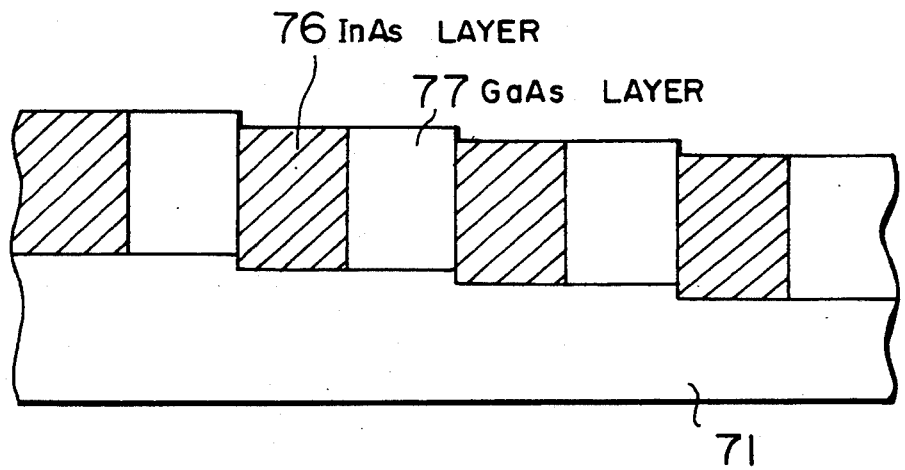

The above processes are repeated to form a periodical structure or vertical type superlattice on the terraces 72 of the tilted InP substrate 1, the periodical structure being formed by InAs monocrystal layers 76 and GaAs monocrystal layers 77 as shown in FIG. 21D.

Figure 22A:
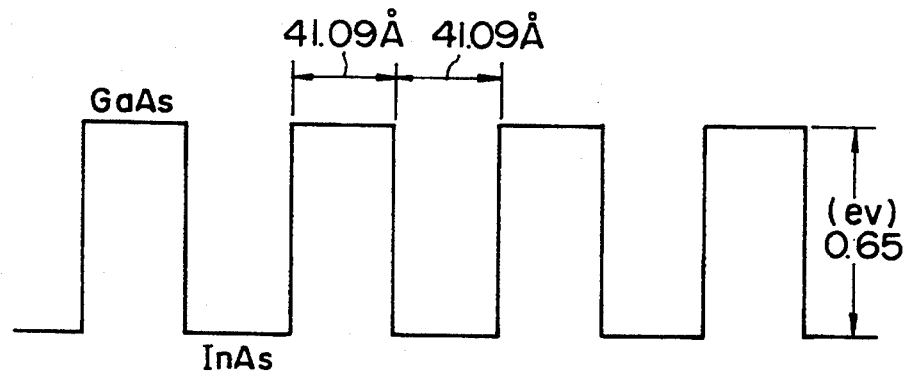
FIGS. 22A and 22B are schematic diagrams showing the band structure of the ordered mixed crystal shown in FIGS. 21A to 21D.
Figure 22B:
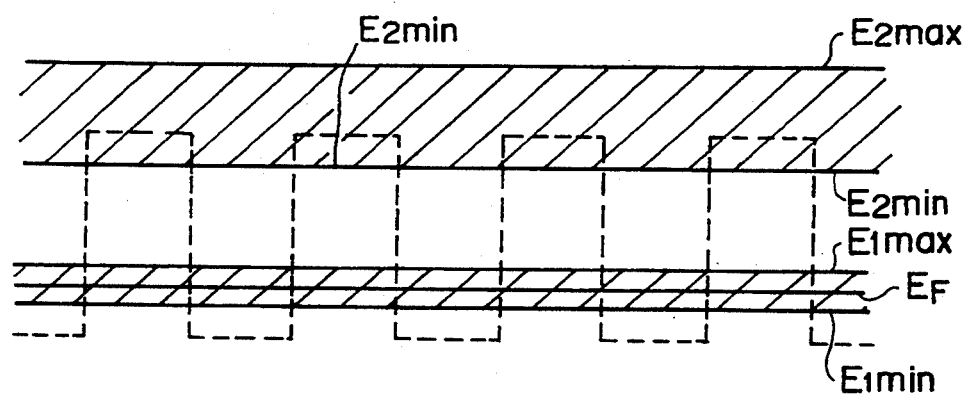

FIGS. 22A and 22B are schematic diagrams explaining a channel layer.

FIG. 22A shows the energy bands of the InAs monocrystal layer 76 and GaAs monocrystal layer 77 of the structure shown in FIG. 21D. As shown in FIG. 22A, the width of the InAs monocrystal layer 76 as the quantum well layer is 41.09 A, the width of the GaAs monocrystal layer 77 as the barrier layer is 41.09 A, and the potential difference between the conduction bands is 0.65 eV.

FIG. 22B illustrates minibands governing electron motion in the periodicity direction formed by the periodical structure of the energy band of the vertical superlattice.

In FIG. 22B, $E_F$ represents the Fermi level, $E_{1min}$ is about 192 meV, $E_{1max}$ is about 218 meV, $E_{2min}$ is about 607 meV, $E_{2max}$ is about 807 meV, $E_{1max}-E_{1min}$ is about 26 meV, and $e_{2min}-E_{1max}$ is about 389 meV.

The scattering of optical phonons occurs when electrons emit or absorb optical phonons.

If the transition after electrons emit or absorb phonons is to the forbidden band of a miniband, the optical phonon scattering will not occur.

In order to satisfy the above status, electrons are doped so that they are filled in the lowest miniband $E_{1max}-E_{1min}$, and the second and following minibands become empty. In addition, the width of the lowest miniband $E_{1max} - E_{1min}$ is set lower than the optical phonon having the smallest energy, and the bank gap $E_{2min}-E_{1max}$ between the lowers miniband and second miniband is set higher than the optical phonon having the largest energy.

With such an arrangement, the transition after electrons emit or absorb phonons is to the forbidden band of a miniband, and so the optical phonon scattering is suppressed.

The above-described embodiment is tested to determine whether the above conditions are met.

The energy of the optical phonon in InAs is about 30 meV, and that in GaAs is about 36 meV. As described earlier, the bandwidth of the lowest miniband is about 26 meV, and the band gap between the lowest miniband and the second miniband is about 389 meV. From the comparison of these values, it is seen that the above conditions inhibiting optical phonon transition are met.

Optical phonon scattering cannot necessarily be suppressed completely even if these conditions are met.

Specifically, representing the direction of periodicity by a x-axis and the direction perpendicular to periodicity (direction without periodicity) by a y-axis, it is possible to form minibands suppressing the scattering of electrons relative to the momentum of electrons moving in the x-axis direction. However, energy level is continuous for the momentum in the y-axis direction so that minibands capable of suppressing the scattering in this direction will not be formed.

It is therefore a possibility that electrons will obtain momentum in the y-axis direction by absorbing optical phonons.

However, such a change in momentum will have only a small effect on scattering in the y-axis direction, and the influence on mobility is less. As a result, most of the optical phonon scattering is suppressed so that electron mobility is increased even at the room temperature.

The above-described vertical superlattice may be used as the channel layer of a HEMT.

Figure 23A:
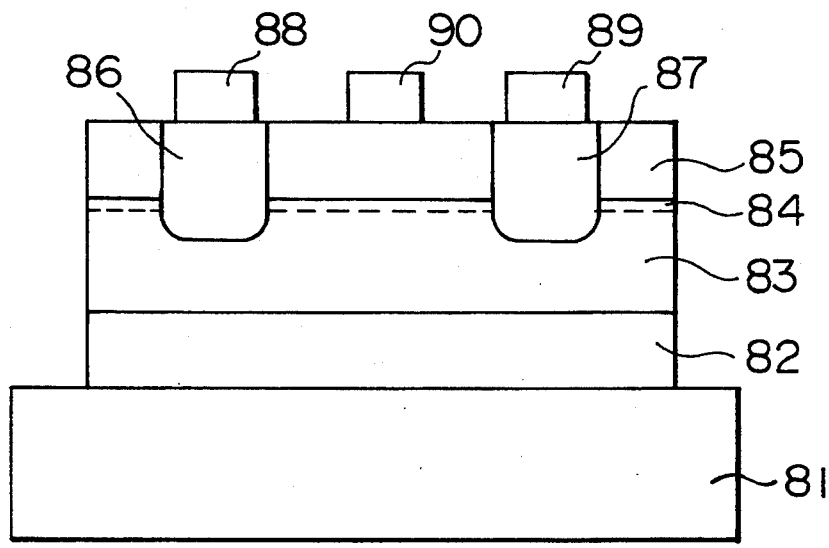
FIGS. 23A and 23B are a cross sectional view showing the structure of a HEMT and a schematic diagram showing its energy band structure according to an embodiment of the present invention.
Figure 23B:
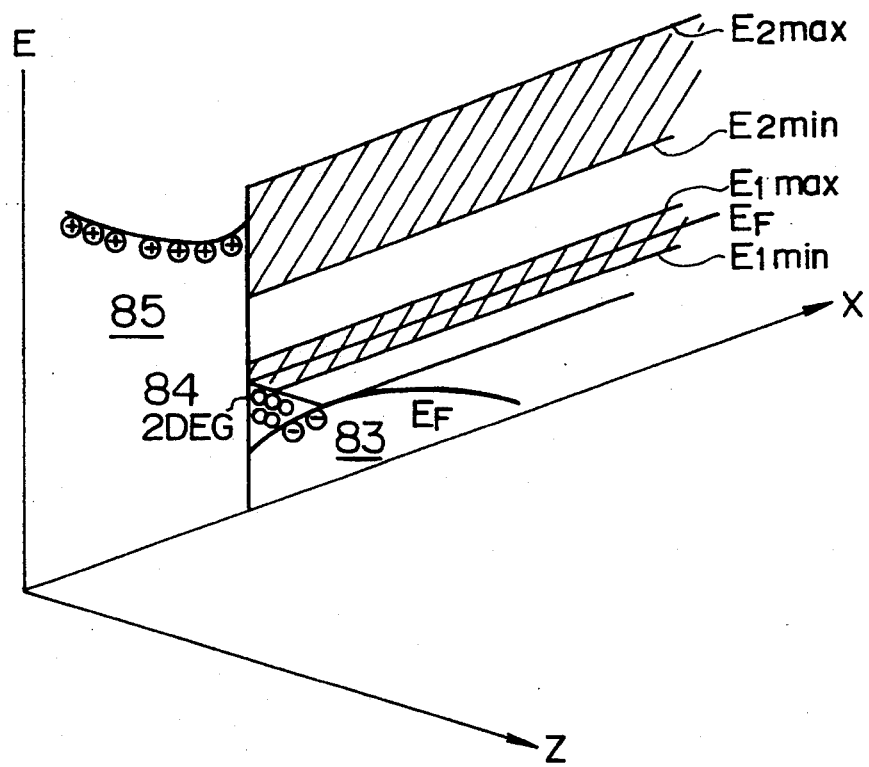

FIGS. 23A and 23B are schematic diagrams explaining the above-described HEMT.

FIG. 23A shows the structure of the HEMT, and FIG. 23B is an energy band diagram of the channel layer of the HEMT.

In FIGS. 23A and 23B, reference numeral 81 represents an InP tilted substrate, reference numeral 82 represents a buffer layer, reference numeral 83 represents an i-type vertical superlattice, reference numeral 84 represents a two-dimensional electron gas layer, reference numeral 85 represents an electron supply layer serving also as a buffer layer, reference numeral 86 represents a source region, reference numeral 87 represents a drain region, reference numeral 88 represents a source electrode, reference numeral 89 represents a drain electrode, and reference numeral 20 represents a gate electrode.

Referring to FIG. 23A, the structure and the manufacturing steps of the HEMT as well will be described.

First, on the InP substrate 81 tilted by 1.50 from the (110) surface in the <00-1> direction, the buffer layer 82 made of $In_{0.53}Ga_{0.47}As$ is grown by MBE.

On the buffer layer 82, an i-type vertical superlattice 83 is formed which is the channel layer made of an InAs layer and a GaAs layer as described previously.

On the channel layer 83, an electron supply layer 85 serving also as a buffer layer is grown from n-type $In_{0.52}Ga_{0.48}As$.

N-type impurity ions are selectively injected to form the source region 86 and drain region 87. The source electrode 88 and drain electrode 89 are formed on the source region 86 and drain region 87. The gate electrode 90 is formed on the electron supply layer 85 serving also as the buffer layer between the source region 86 and drain region 87.

The two-dimensional electron gas (2 DEG) layer 84 is the layer which is modulation-doped by the electron supply layer 85 service also as a buffer layer.

In the energy band diagram of the HEMT channel shown in FIG. 23B, the two-dimensional electron gas (2 DEG) layer is formed at the hetero-junction interface in the z-axis direction, and minibands suppressing optical phonon scattering are formed in the x-axis direction along which electrons are transported.

This HEMT structure provides a high electron mobility semiconductor device operable at the room temperature.

FIGS. 24A to 24D illustrate the manufacturing steps for a high electron mobility semiconductor device according to another embodiment of the present invention.

In FIGS. 24A to 24D, reference numeral 91 represents an InP substrate, reference numeral 92 represents a terrace, reference numeral 93 represents a terrace, reference numeral 94 represents a GaAs monomolecular layer, reference numeral 95 represents an InAs monomolecular layer, and reference numeral 96 represents a superlattice of a checkerboard pattern.

Figure 24A:
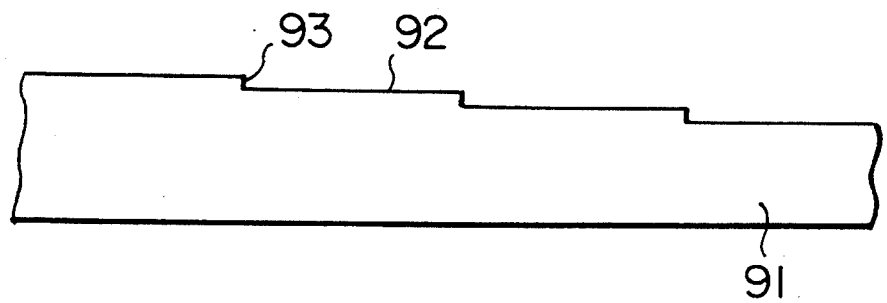
FIGS. 24A to 24D are schematic cross sectional views illustrating the processes for manufacturing a HEMT according to an embodiment of the present invention.

As shown in FIG. 24A, an InP substrate 91 which is tilted by 1.7° from the (110) surface in the <00-1> direction is prepared.

The width of the terrace 92 for this substrate corresponds to a twelve molecule layer which is slightly narrower than that of the above-described embodiment.

Figure 24B:
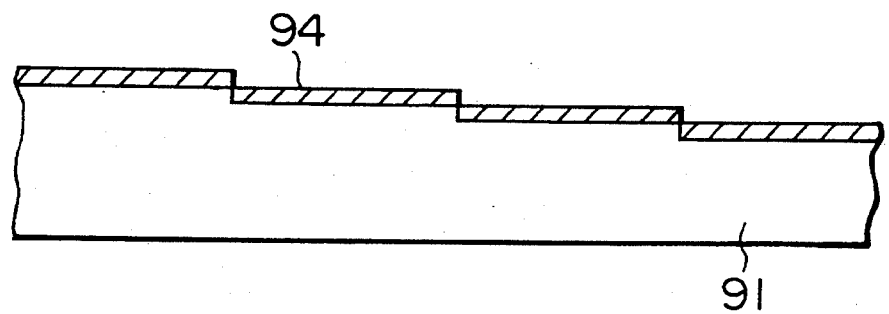

Next, as shown in FIG. 24B, on the terrace 92 of the InP substrate 91, a GaAs monomolecular layer 94 is formed by MBE of twelve molecules starting from the step edge 93.

Figure 24C:
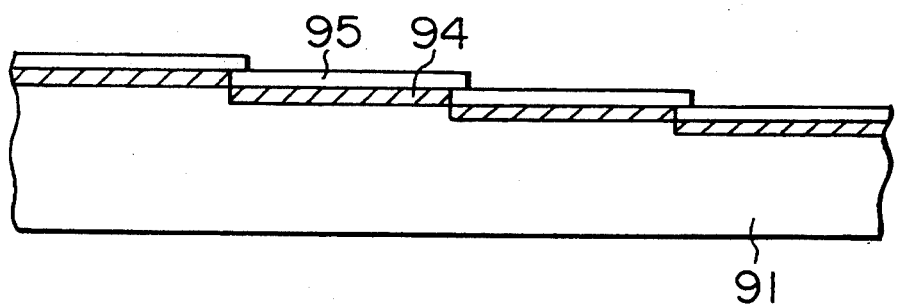

Next, as shown in FIG. 24C, after changing the source material, an InAs monomolecular layer 95 is grown to a length of thirteen molecules on the GaAS monomolecular layer 94 of twelve molecules.

Figure 24D:
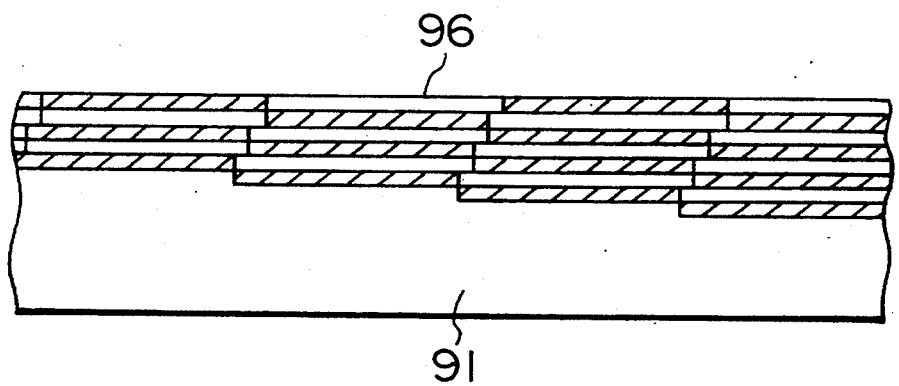

The above processes are repeated so as to form on the terraces 92 of the InP substrate 91, a superlattice 96 of checkerboard pattern or periodic structure made of the GaAs monomolecular layers 94 and InAs monomolecular layers 95, as shown in FIG. 24D.

Figure 25A:
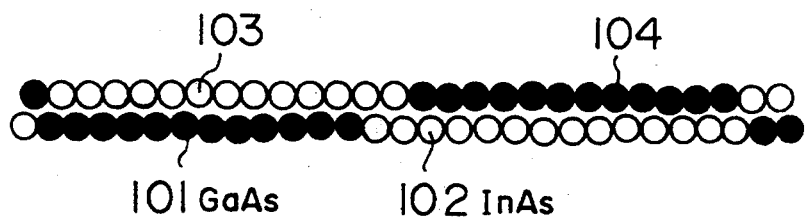
FIGS. 25A to 25C are a schematic diagram explaining the details of the ordered mixed crystal shown in FIGS. 24A to 24D and graphs showing the band structure.
Figure 25B:
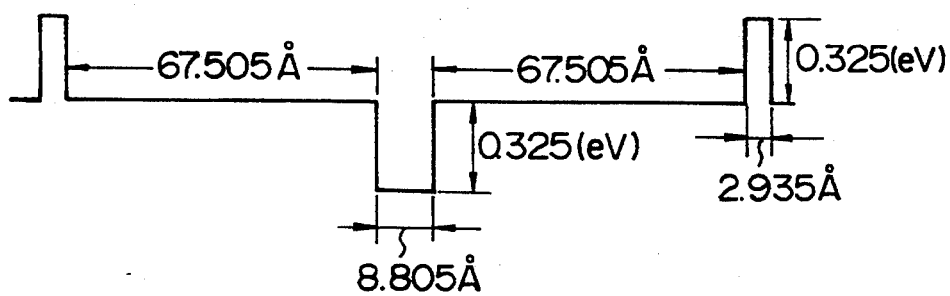
Figure 25C:
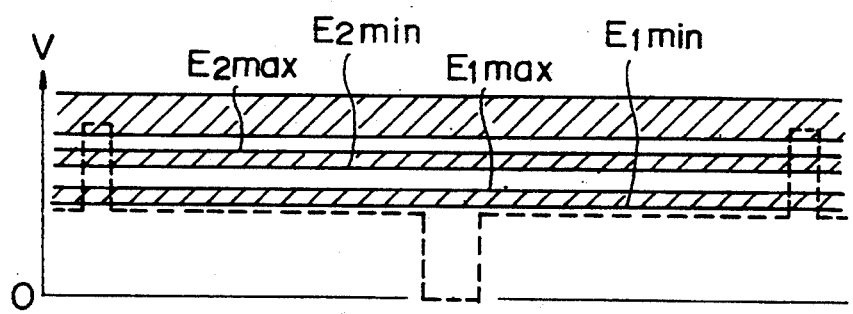

FIGS. 25A to 25C are schematic diagrams explaining the channel layer of this embodiment.

FIG. 25A illustrates a manufacturing step for a checkerboard pattern superlattice to be used as the channel layer of this embodiment. FIG. 25B is an energy band diagram, and FIG. 25C is a diagram showing minibands.

With reference to the schematic diagram of FIG. 25A, a step for manufacturing a checkerboard pattern superlattice for use as a channel layer will be described in part.

In FIG. 25A, reference numerals 101 and 104 represent GaAs monomolecuar layers, and reference numerals 102 and 103 represent InAs monomolecular layers.

FIG. 25A shows only two layers of the checkerboard pattern superlattice in the width direction. On the tilted InP substrate, GaAs monomolecular layers 101 and 104 of twelve molecules and InAs monomolecular layers 102 and 103 of thirteen molecules are alternately laminated.

As seen from FIG. 25A, the underlying InAs monomolecular layer 102 is superposed by the upper InAs monomolecular layer 103 by a width corresponding to 1.5 molecules, between the upper and lower InAs monomolecular layers 101 and 104.

With this superposed width, it is possible to control the effective width of the high and low potential regions of the energy band generated by the GaAs or InAs monomolecular layers.

This superposed width is required to be generally 1.5 molecule although it depends upon the material.

Calculations using the effective mass approximation of the molecules in the periodical structure will provide the energy band structure shown in FIG. 25B.

In this embodiment, the periodical structure extends in the growth direction and in a direction perpendicular to the growth direction. The width of the high potential region is 2.935 A and its potential is 0.325 eV, and the width of the low potential region is 8.805 A and its potential is 0.325 eV, the distance between the high and low potential regions being 67.605 A.

FIG. 25C shows minibands generated by the periodical structure having such potential energies. $E_{1min}$ is about 300 meV, $E_{1max}$ is about 320 meV, $E_{2min}$ is abount 379 meV, $E_{2max}$ is about 468 meV, $E_{1max}-E_{1min}$ is abount 19 meV, and $E_{2min}-E_{1max}$ is about 59 meV.

This embodiment is tested to determine whether the conditions suppressing optical phonon scattering are met.

The energy of phonons in InAs is about 30 meV, the energy of optical phonons in GaAs is about 36 meV, the bandwidth of the lowest miniband is about 19 meV, and the band gap between the lowest miniband and the second miniband is about 59 meV.

From a comparison of these values, it is seen that the above-described conditions for suppressing optical phonon scattering by electrons are satisfied.

The above-described checkerboard pattern superlattice may be used as a HEMT channel layer.

Figure 26A:
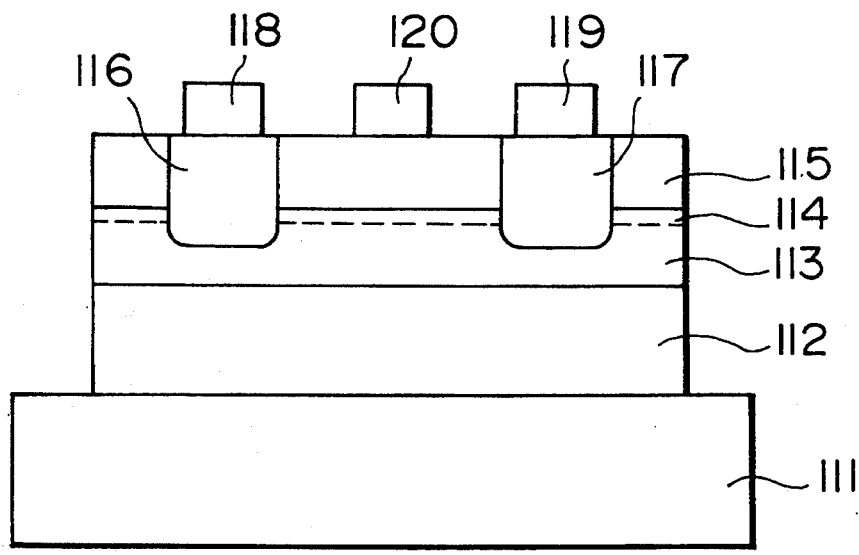
FIGS. 26A and 26B are a schematic diagram in section showing the structure of a HEMT and a schematic diagram showing its band structure according to an embodiment of the present invention.
Figure 26B:
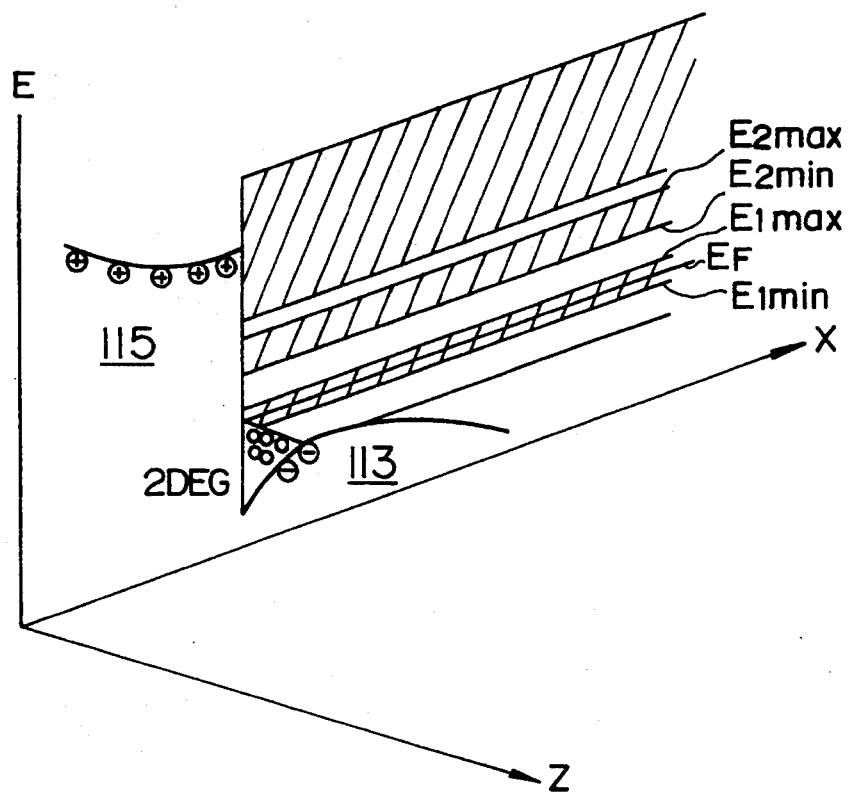

FIGS. 26A and 26B are schematic diagrams explaining the above-described HEMT.

FIG. 26A shows the structure of the HEMT, and FIG. 26B is an energy band diagram of the channel layer of the HEMT.

In FIGS. 26A and 26B, reference numeral 111 represents an InP tilted substrate, reference numeral 112 represents a buffer layer, reference numeral 113 represents an i-type checkerboard pattern superlattice, reference numeral 114 represents a two-dimensional electron gas layer, reference numeral 115 represents an electron supply layer serving also as a buffer layer, reference numeral 116 represents a source region, reference numeral 117 represents a drain region, reference numeral 118 represents a source electrode, reference numeral 119 represents a drain electrode, and reference numeral 120 represents a gate electrode.

Referring to FIG. 26A, the structure and the manufacturing steps of the HEMT as well will be described briefly.

First, on the InP substrate 111 which is tilted by 1.7° from the (110) surface in the <00-1> direction, a buffer layer 112 made of $In_{0.53}Ga_{0.47}As$ is grown by MBE. On the buffer layer 112, an i-type checkerboard pattern superlattice 113 is formed which is the channel layer made of the InAs layer and GaAs layer as described previously. On the channel layer 113, an electron supply layer 115 serving also as a buffer layer made of n-type in$_{0.52}$Ga$_{0.48}$As is grown.

N-type impurity ions are selectively injected to form the source region 116 and drain region 117. The source electrode 118 and drain electrode 119 are formed on the source region 116 and drain region 117. The gate electrode 120 is formed on the electron supply layer 115 serving also as the buffer layer between the source region 116 and drain region 117.

The two-dimensional electron gas (2 DEG) layer 114 is modulation-doped by the electron supply layer 115 serving also as the buffer layer.

In the energy band diagram of the HEMT channel shown in FIG. 26B, the two-dimensional electron gas (2 DEG) is formed at the hetero junction interface in the z-axis direction, and minibands suppressing optical phonon scattering are formed in the x-axis direction along with electrons are transported. Accordingly, this HEMT structure provides a high electron mobility semiconductor device which is operable at the room temperature.

In the above two embodiments, optical phonon scattering of electrons cannot necessarily be suppressed completely.

Specifically, representing the direction of periodicity by an x-axis and a direction perpendicular to periodicity by a y-axis, it is possible to form minibands suppressing the scattering of electrons relative to the momentum of electrons moving in the x-axis direction. However, the energy level is continuous for the momentum in the y-axis direction so that minibands capable of suppressing scattering in this direction will not be formed. There is therefore a possibility for electrons to obtain momentum in type y-axis direction by absorbing optical phonons.

In order to suppress such optical phonon scattering in the y-axis direction, the channel layer is made periodical also in the y-axis direction. To this end, a (110) substrate tilted, for example, in the <00-1> direction and in a direction perpendicular to the <00-1> direction, may be used.

By properly setting the band structure of minibands formed through quantumization to the structure suitable for optical phonons, it is possible to suppress optical phonon scattering and provide a high electron mobility semiconductor device that is operable at the room temperature. The formation of minibands is not limited to the (100) substrate, but other surface orientations such as the (110) plane may also be used.

We claim:

1. A semiconductor device comprising a charge carrier flow region having a superlattice structure, said superlattice structure comprising two or more discrete monomolecular layers of different binary group III–V compounds disposed in periodically ordered relationship in <110> and <001> directions, said device further including a substrate having a surface on which said superlattice structure is formed, said surface being tilted from the (110) plane in the <00-1> direction.

2. A semiconductor device according to claim 1, further comprising an electrical structure facilitating transportation of charge carriers in said region in a <110>, a <−110> or a <001> direction.

3. A semiconductor device according to claim 1, wherein said substrate comprises a group III–V compound semiconductor substrate and said surface is tilted at an angle α within the range of from about 0.5 to 10 degrees from the (110) plane in the <00-1> direction.

4. A semiconductor device according to claim 3, further comprising an electrical structure facilitating transportation of charge carriers in said region in a <110>, a <−110> or a <001> direction.

5. A semiconductor device according to claim 4, wherein said layers are disposed at a period L in the <001> direction, L being about two times the mean pitch of monomolecular steps generated on said surface in accordance with said angle α thereof.

6. A semiconductor device according to claim 5, wherein said electrical structure facilitates transportation of said charge carriers in the <001> direction, and said angle α is selected such that the period L inhibits optical phonon transition of carriers transported in the <001> direction.

7. A semiconductor device according to claim 3, wherein said layers are formed of GaAs, AlAs, InAs, GaSb, AlSb, or mixed crystals thereof, and said substrate is InP.

8. A semiconductor device according to claim 3, wherein said layers are formed of InAs, GaSb, AlSb, or mixed crystals thereof, and said substrate is GaSb or InAs.

9. A semiconductor device according to claim 3, wherein said layers are formed of GaAs, AlAs, GaP, AlP, InP, or mixed crystals thereof, and said substrate is GaAs.

10. A semiconductor device according to claim 3, wherein said layers are disposed at a period L in the <001> direction, L being about two times the mean pitch of monomolecular steps generated on said surface in accordance with said angle of α thereof.

11. A semiconductor device according to claim 3, wherein said surface of said substrate is tilted at said angle α in both the <00-1> and <−110> directions.

12. A semiconductor device according to claim 1, wherein said region portion comprises a first charge carrier transport layer, said device including a second charge carrier transport layer made of a disordered crystal containing the same group III–V compounds as said superlattice structure, said semiconductor device further including circuit forming structure causing the charge carriers to flow divisionally through said first and second charge carrier transport layers in accordance with an externally applied signal voltage modulating the transport velocity of the charge carrier.

13. A semiconductor device according to claim 1 having light emission or reception characteristics, further comprising two semiconductor clad layers of different conductivity types sandwiching said region portion and having a band gap broader than the narrowest band gap of said layers constituting said region portion.

14. A semiconductor device comprising:
a semiconductor substrate having a tilted surface; and
a superlattice structure formed on said surface and having an ordered periodicity in the tilted direction, said structure being such that the width of a miniband of the highest energy having electrons therein is narrower than the energy of an optical phonon, and the energy of a forbidden band therein between said miniband of the highest energy having electrons and a miniband of the lowest energy without electrons therein is higher than the energy of the optical phonon, said surface being tilted from the (110) plane in the <00-1> direction.

15. A semiconductor device according to claim 14, wherein said surface is tilted at an angle α within the range of from about 0.5 to 10 degrees from the (110) plane in the <00-1> direction.

16. A semiconductor device according to claim 15, further comprising an impurity doped semiconductor carrier supply layer formed on said superlattice structure.

17. A semiconductor device according to claim 16, further comprising a pair of current electrodes formed on said carrier supply layer, said electrodes being spaced apart in the tilted direction.

* * * * *